(12) United States Patent
Han et al.

(10) Patent No.: US 11,912,728 B2
(45) Date of Patent: Feb. 27, 2024

(54) ALUMINUM COMPOUNDS AND METHODS OF FORMING ALUMINUM- CONTAINING FILM USING THE SAME

(71) Applicant: UP CHEMICAL CO., LTD., Pyeongtaek-si (KR)

(72) Inventors: Won Seok Han, Pyeongtaek-si (KR); Dong Hwan Ma, Seoul (KR); Sungwoo Ahn, Yangju-si (KR); Dae-young Kim, Pyeongtaek-si (KR); Wonyong Koh, Daejeon (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/156,678

(22) Filed: Jan. 25, 2021

(65) Prior Publication Data

US 2021/0147450 A1    May 20, 2021

Related U.S. Application Data

(63) Continuation of application No. PCT/KR2019/009494, filed on Jul. 30, 2019.

(30) Foreign Application Priority Data

Jul. 30, 2018  (KR) .......................... 10-2018-0088333

(51) Int. Cl.
   *C07F 5/06*     (2006.01)
   *C23C 16/30*    (2006.01)
   *C23C 16/455*   (2006.01)

(52) U.S. Cl.
   CPC ............ *C07F 5/069* (2013.01); *C23C 16/303* (2013.01); *C23C 16/45527* (2013.01)

(58) Field of Classification Search
   CPC ...................................................... C07F 5/069
   See application file for complete search history.

(56) References Cited

U.S. PATENT DOCUMENTS

| | | | |
|---|---|---|---|
| 5,874,131 A | 2/1999 | Vaartstra | |
| 5,880,303 A * | 3/1999 | Choi ....................... | C07F 5/069 556/27 |
| 6,380,383 B1 | 4/2002 | Shin | |
| 11,505,562 B2 * | 11/2022 | Mayr ...................... | C23C 16/20 |
| 2006/0257567 A1 * | 11/2006 | Peters ................... | C23C 16/403 427/532 |
| 2011/0084230 A1 * | 4/2011 | Knochel ................ | C07F 13/00 585/24 |
| 2015/0004314 A1 * | 1/2015 | Winter ................... | C07F 7/0805 423/493 |
| 2015/0266904 A1 * | 9/2015 | Yoshino ............ | C23C 16/45553 556/176 |
| 2018/0076024 A1 | 3/2018 | Park | |
| 2021/0079025 A1 * | 3/2021 | Mayr ....................... | C23C 16/08 |

FOREIGN PATENT DOCUMENTS

| | | |
|---|---|---|
| CN | 107406465 A | 11/2017 |
| CN | 111727271 A | 9/2020 |
| EP | 1335416 A1 | 8/2003 |
| EP | 1788116 A1 | 5/2007 |
| TW | 201427985 A | 7/2014 |
| WO | 2014103588 A1 | 7/2014 |
| WO | 2016-133365 A1 | 8/2016 |
| WO | 2019120743 A1 | 6/2019 |
| WO | WO-2019120743 A1 * | 6/2019 ............. C07F 5/067 |

OTHER PUBLICATIONS

CAS Abstract and Indexed Compound H. Choi et al., 10 Chemistry of Materials, 2323-2325 (1998) (Year: 1998).*
K. Blakely et al., 30 Chemistry of Materials, 1844-1848 (Mar. 12, 2018) (Year: 2018).*
V. Astié, et al., Chapter 2, "Direct liquid injection chemical vapor deposition." Chemical Vapor Deposition for Nanotechnology (2018) (Year: 2018).*
N. Fetter et al., 42 Canadian Journal of Chemistry, 885-892 (1964) (Year: 1964).*
M. Gardiner et al., 35 Inorganic Chemistry, 4652-4659 (1995) (Year: 1995).*
K. Blakeney et al., 47 Dalton Transactions, 10897-10905 (2018) (Year: 2018).*
H. Choi et al., 10 Chemistry of Materials, 2323-2325 (1998) (Year: 1998).*
International Search Report of PCT/KR2019/009494 dated Oct. 25, 2019.
Jiang, Z. et al., "N,N'-Bis(triethylaluminio) ethylenediamine- and N,N'-Bis (trimethylaluminio) ethylenediamine-Derived Organometallic Precursors to Aluminum Nitride: Syntheses, Structures and Pyrolyses", Chem. Mater., 1990, vol. 2, pp. 439-446.
Blakeney, K. J. et al., "Aluminum dihydride complexes and their unexpected application in atomic layer deposition of titanium carbonitride films" Dalton Transactions, Jul. 13, 2018, vol. 47, pp. 10897-10905.
U.S. Appl. No. 62/763,125, filed Dec. 20, 2017, document made available for PCT/EP2018/080738 under the PCT (date receipt at the international bureau: Jan. 25, 2019), retrieved via WIPO Patentscope.
U.S. Appl. No. 62/763,136, filed Mar. 7, 2018, document made available for PCT/EP2018/080738 under the PCT (date receipt at the international bureau: Jan. 25, 2019), retrieved via WIPO Patentscope.
O. T. Beachley, Jr. et al., Chelation in Organoaluminum-Nitrogen Chemistry, Inorganic Chemistry, vol. 15, No. 9, Dec. 31, 1976, pp. 2110-2115.

(Continued)

*Primary Examiner* — Alexander R Pagano
(74) *Attorney, Agent, or Firm* — Shih IP Law Group, PLLC.

(57) ABSTRACT

The present disclosure relates to a novel aluminum-containing compound, a method of preparing the aluminum-containing compound, a precursor composition for forming a film including the aluminum-containing precursor compound, and a method of forming an aluminum-containing film using the precursor composition for forming a film.

11 Claims, 14 Drawing Sheets

(56) References Cited

OTHER PUBLICATIONS

C. Niamh McMahon et al., Aluminium compounds containing bidentate ligands: ligand base strength and remote geometric control over degree of association, Journal of the Chemical Society, Dalton Transactions, Jan. 1, 1999, pp. 67-72.

* cited by examiner

ALUMINUM COMPOUNDS AND METHODS OF FORMING ALUMINUM- CONTAINING FILM USING THE SAME

CROSS-REFERENCE TO RELATED APPLICATIONS

This application is a continuation of PCT Application No. PCT/KR2019/009494, filed on Jul. 30, 2019, which claims priority to Korean Patent Application Number 10-2018-0088333, filed on Jul. 30, 2018, both of which are hereby incorporated by reference in their entirety.

TECHNICAL FIELD

The present disclosure relates to a novel aluminum-containing compound, a method of preparing the aluminum-containing compound, a precursor composition for forming a film including the aluminum-containing precursor compound, and a method of forming an aluminum-containing film using the precursor composition for forming a film.

BACKGROUND

Various aluminum-containing compounds including trimethylaluminum (hereinafter, also referred to as "TMA") are known as precursors for chemical vapor deposition (CVD) and atomic layer deposition (ALD).

In the ALD using plasma, the plasma increases the reactivity of precursors, expands the range of choice in precursors, improves the properties of a thin film, shortens time to form a thin film and increases the productivity of ALD process. However, when a thin film is deposited using plasma, there is a possibility that a substrate and/or the thin film thereon are to be damaged by ions in the plasma, and thus the properties of the thin film can be degraded. Further, the plasma cannot penetrate into deep and narrow trenches, and thus an aluminum-containing film, particularly an aluminum nitride (hereinafter, also referred to as "AlN") film, having a uniform thickness cannot be formed in the deep and narrow trenches by plasma-enhanced ALD (PEALD). Therefore, to form a uniform aluminum-containing film on a substrate with deep corrugations (trenches) on its surface or a porous substrate, a precursor suitable for thermal ALD that does not use plasma is needed.

A method of forming an aluminum nitride film by alternately supplying TMA and ammonia ($NH_3$) is known. However, when TMA and $NH_3$ are alternately supplied according to a conventional method, the film growth is not saturated but continuously increases during ALD gas supply cycle by increasing the TMA supply time and the $NH_3$ supply time and thereby does not proceed in layer-by-layer mode. Further, as the substrate temperature increases, the film growth per gas supply cycle also increases steeply. Therefore, the ALD in which TMA and $NH_3$ are alternately supplied does not show the advantage of ALD, i.e., uniform film growth in spite of changes in source gas supply time and substrate temperature in one gas supply cycle [see D. Riihelä et al. "Low temperature deposition of AlN films by an alternate supply of trimethyl aluminum and ammonia," Chemical Vapor Deposition, Volume 2, 277 (1996)]. Accordingly, TMA and $NH_3$ are not suitable for precisely controlling the AlN film growth in a semiconductor device production process. Thermal ALD using $NH_3$ and $AlCl_3$ instead of TMA enables to form an aluminum nitride film at a high temperature of 500° C. or more. However, $AlCl_3$ is a solid that sublimates at a high temperature and thus is inconvenient to use in a semiconductor device manufacturing apparatus and cannot be used when a film needs to be formed at a low temperature.

Kyle J. Blakeney and Charles H. Winter disclosed $H_2Al[N^tBu(CH_2)_2NMe_2]$ that is solid at room temperature as an aluminum hydride complex which can be used for depositing an aluminum metal film [see Kyle J. Blakeney and Charles H. Winter, "Atomic Layer Deposition of Aluminum Metal Films Using a Thermally Stable Aluminum Hydride Reducing Agent", Chem. Mater., 30, 1844-1848, (2018)]. However, this document discloses that $H_2Al(N^tBu(CH_2)_2 NMe_2)$ can be used for depositing an Al metal film, but does not disclose the deposition of an aluminum nitride film. Further, $H_2Al(N^tBu(CH_2)_2NMe_2)$ is solid at room temperature and thus is not suitable to be used for a liquid delivery system now commonly used in a semiconductor device production equipment.

DISCLOSURE OF THE INVENTION

Problems to be Solved by the Invention

The present disclosure is conceived to provide a novel aluminum-containing compound, a method of preparing the aluminum-containing compound, a precursor composition for forming a film including the aluminum-containing precursor compound, and a method of forming an aluminum-containing film using the precursor composition for forming a film.

However, problems to be solved by the present disclosure are not limited to the above-described problems. Although not described herein, other problems to be solved by the present disclosure can be clearly understood by those skilled in the art from the following description.

Means for Solving the Problems

According to a first aspect of the present disclosure, there is provided an aluminum-containing compound, represented by the following Chemical Formula 1:

[Chemical Formula 1]

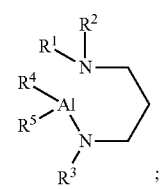

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

According to a second aspect of the present disclosure, there is provided a method of preparing an aluminum-containing compound of the first aspect of the present disclosure represented by the following Chemical Formula 2, including: reacting $AlH_3$ with a dialkylaminopropylalkylamine represented by the following Chemical Formula 4:

[Chemical Formula 4]

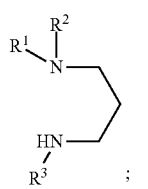

[Chemical Formula 2]

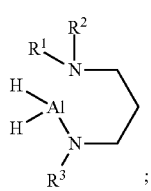

wherein, in the above Chemical Formulas 2 and 4, each of $R^1$ and $R^2$ is independently a linear or branched alkyl group having 1 to 5 carbon atoms, and $R^3$ is a linear or branched alkyl group having 4 or 5 carbon atoms.

According to a third aspect of the present disclosure, there is provided a method of preparing an aluminum-containing compound of the first aspect of the present disclosure represented by the following Chemical Formula 3, including: reacting $AlX_3$ sequentially with an alkali metal salt of a dialkylaminopropylalkylamine represented by the following Chemical Formula 4 and an alkali metal salt of a dialkylamine:

[Chemical Formula 4]

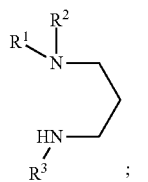

[Chemical Formula 3]

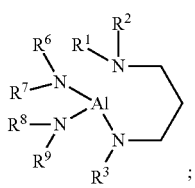

wherein the dialkylamine is represented by $NHR^6R^7$ and $NHR^8R^9$;

wherein, in the above Chemical Formulas 3 and 4 and the dialkylamine, each of $R^1$ to $R^3$ is independently a linear or branched alkyl group having 1 to 5 carbon atoms, each of $R^6$ to $R^9$ is independently a linear or branched alkyl group having 1 to 3 carbon atoms, and the above $NHR^6R^7$ and $NHR^8R^9$ are the same or different to each other; and wherein, in the above $AlX_3$, X is a halogen atom.

According to a fourth aspect of the present disclosure, there is provided a precursor composition for forming a film, including an aluminum-containing precursor compound represented by the following Chemical Formula 1:

[Chemical Formula 1]

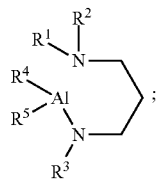

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

According to a fifth aspect of the present disclosure, there is provided a method of forming an aluminum-containing film, including: forming the aluminum-containing film using a precursor composition for forming a film including an aluminum-containing precursor compound represented by the following Chemical Formula 1:

[Chemical Formula 1]

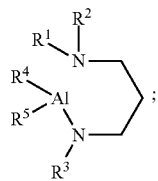

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

Effects of the Invention

An aluminum-containing compound represented by the Chemical Formula 1 according to embodiments of the present disclosure is a novel compound that is formed by binding a bidentate ligand, which is (3-dialkylamino)propylalkylamine, to aluminum and has not been known.

The aluminum-containing compounds according to embodiments of the present disclosure have high thermal stability and thus can be used as a precursor for ALD or CVD and can also be used for forming an aluminum-containing film. Particularly, these compounds have significant effects in that these can be used for uniformly forming an aluminum-containing film having a thickness ranging a few angstrom (Å) to a few nm or to several tens nm on a substrate with corrugations (trenches) on its surface or a porous substrate, and for example, in a substrate with fine corrugations (trenches) having an aspect ratio of about 1 or more and a width of about 1 μm or less, these compounds can be used for uniformly forming an aluminum-containing film having a thickness ranging a few angstrom (Å) to a few nm or to several tens nm on the entire surfaces of the substrate trenches including lower surfaces of the fine corrugations (trenches), upper surfaces of the fine corrugations (trenches), and lateral surfaces of the fine corrugations (trenches).

The aluminum-containing compounds according to embodiments of the present disclosure are liquid at room temperature and thus advantageous to be used as an ALD or CVD precursor. It is increasingly common that an ALD or CVD precursor is automatically supplied using a liquid delivery system in a semiconductor device production equipment. If the ALD or CVD precursor is solid at room temperature, it is impossible or very inconvenient to use such the ALD or CVD precursor in the liquid delivery system.

The aluminum-containing compounds according to embodiments of the present disclosure can be used as an ALD or CVD precursor to form an aluminum-containing film, particularly, an aluminum nitride film. Particularly, the aluminum-containing compounds according to embodiments of the present disclosure can be used as an ALD precursor to form an aluminum-containing film, particularly, an aluminum nitride film.

The aluminum-containing compounds according to embodiments of the present disclosure can be used as a precursor for thermal ALD that does not use plasma, and during the deposition, a film growth can be maintained relatively uniformly, and thus a high-quality film can be uniformly formed. When an instable or non-dense aluminum nitride film is exposed to air, oxygen penetrates into the film. However, since an aluminum nitride film formed according to embodiments of the present disclosure has high quality, even when it is exposed to air, oxidation of the aluminum nitride film is limited only on the surface of the film and below the surface the aluminum nitride film is not oxidized. Meanwhile, when a film is deposited by PEALD, there is a possibility that a substrate and/or the thin film thereon are to be damaged by ions in plasma, and thus the properties of the thin film can be degraded. Further, the plasma cannot penetrate into deep and narrow trenches, and thus an aluminum-containing film, particularly an aluminum nitride film, having a uniform thickness cannot be formed in the deep and narrow trenches by the PEALD. Therefore, to form a uniform aluminum-containing film on a substrate with corrugations (trenches) on its surface or a porous substrate, a precursor suitable for thermal ALD that does not use plasma is needed, which makes the aluminum-containing compounds according to embodiments of the present disclosure useful.

A method of preparing an aluminum-containing film according to embodiments of the present disclosure can be applied to manufacturing commercial semiconductor devices.

The aluminum-containing compounds according to embodiments of the present disclosure can be used as an ALD or CVD precursor with desirable characteristics, e.g., improved thermal stability, high volatility, etc., and thus can be usefully used to form an aluminum-containing film or thin film to manufacture advanced semiconductor devices.

Using the aluminum-containing compounds according to embodiments of the present disclosure as a precursor, it is possible to precisely control the thickness of an aluminum nitride film when forming the aluminum nitride film in manufacturing a semiconductor device with narrow and deep trenches by thermal ALD that does not use plasma. If an aluminum nitride film is formed using the conventional TMA and $NH_3$, the film growth continuously increases as the TMA supply time increases, and when the substrate temperature is changed, a film growth rate is greatly changed. Therefore, the suitable processing temperature range for ALD cannot be observed. Further, the film growth is not saturated in one gas supply cycle and thereby does not proceed in layer-by-layer mode, and thus it is difficult to deposit a uniform film.

BEST MODE FOR CARRYING OUT THE INVENTION

Figure 1:
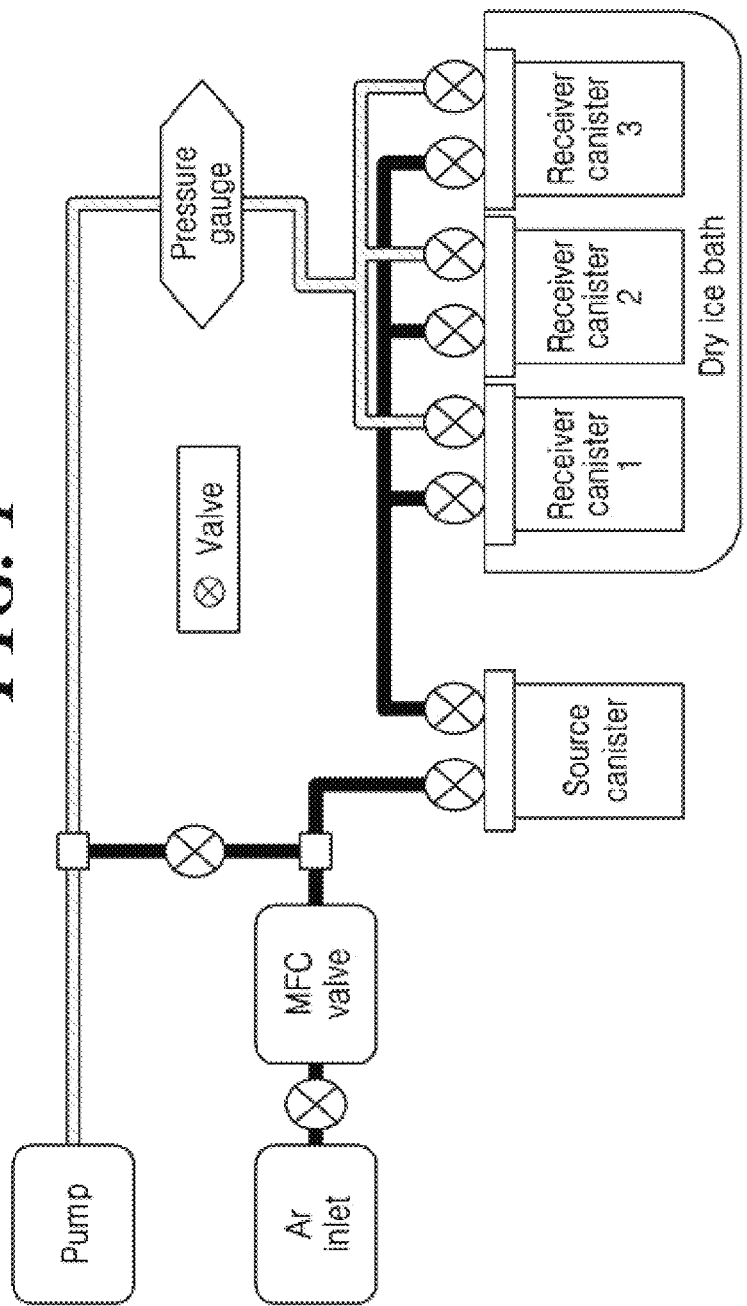
FIG. 1 shows an apparatus for evaluating the thermal stability of an aluminum compound prepared in accordance with embodiments of the present disclosure.

Hereinafter, embodiments and examples of the present disclosure will be described in detail with reference to the accompanying drawings so that the present disclosure may be readily implemented by those skilled in the art. However, it is to be noted that the present disclosure is not limited to the embodiments and examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "alkyl" or "alkyl group" includes linear or branched alkyl groups having 1 to 12 carbon atoms, 1 to 10 carbon atoms, 1 to 8 carbon atoms, or 1 to 5 carbon atoms, and all possible isomers thereof. For example, the alkyl or alkyl group may include methyl (Me), ethyl (Et), n-propyl ($^n$Pr), iso-propyl ($^i$Pr), n-butyl ($^n$Bu), iso-butyl ($^i$Bu), tert-butyl (tert-Bu, $^t$Bu), sec-butyl (sec-Bu, $^{sec}$Bu), n-pentyl ($^n$Pe), iso-pentyl ($^{iso}$Pe), sec-pentyl ($^{sec}$Pe), tert-pentyl ($^t$Pe), neo-pentyl ($^{neo}$Pe), 3-pentyl, n-hexyl, iso-hexyl, heptyl, 4,4-dimethylpentyl, octyl, 2,2,4-trimethylpentyl, nonyl, decyl, undecyl, dodecyl, and isomers thereof, but may not be limited thereto.

Hereafter, embodiments of the present disclosure will be described in detail, but the present disclosure may not be limited thereto.

A first aspect of the present disclosure provides an aluminum-containing compound, represented by the following Chemical Formula 1:

[Chemical Formula 1]

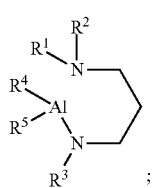

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

In an embodiment of the present disclosure, in the above Chemical Formula 1, when $R^4$ is an alkylamino group, it may be represented by —$NR^6R^7$, and when $R^5$ is an alkylamino group, it may be represented by —$NR^8R^9$, wherein each of $R^6$, $R^7$, $R^8$, and $R^9$ may be independently a linear or branched alkyl group having 1 to 3 carbon atoms, and $R^6$, $R^7$, $R^8$, and $R^9$ may be the same or different to another, but may not be limited thereto.

In an embodiment of the present disclosure, in the above Chemical Formula 1, each of $R^1$, $R^2$, and $R^3$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, and each of $R^6$, $R^7$, $R^8$, and $R^9$ may be independently methyl, ethyl, n-propyl, or iso-propyl, but may not be limited thereto.

In an embodiment of the present disclosure, in the above Chemical Formula 1, each of $R^1$ and $R^2$ may be independently methyl, ethyl, n-propyl, or iso-propyl, and $R^3$ may be methyl, ethyl, n-propyl, iso-propyl, n-butyl, iso-butyl, sec-butyl, or tert-butyl, but may not be limited thereto.

In an embodiment of the present disclosure, in the above Chemical Formula 1, each of $R^1$ and $R^2$ may be independently methyl or ethyl, and $R^3$ may be tert-butyl.

In an embodiment of the present disclosure, in the above Chemical Formula 1, each of $R^6$, $R^7$, $R^8$, and $R^9$ may be independently methyl or ethyl, but may not be limited thereto.

In an embodiment of the present disclosure, the aluminum-containing compound may be represented by the following Chemical Formula 2, but may not be limited thereto:

[Chemical Formula 2]

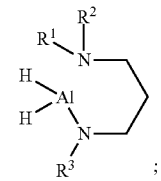

wherein, in the above Chemical Formula 2, each of $R^1$ and $R^2$ is independently a linear or branched alkyl group having 1 to 5 carbon atoms, and $R^3$ is a linear or branched alkyl group having 4 or 5 carbon atoms.

In an embodiment of the present disclosure, in the above Chemical Formula 2, each of $R^1$ and $R^2$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, but may not be limited thereto, and $R^3$ may be iso-butyl, sec-butyl, tert-butyl, n-pentyl, iso-pentyl, sec-pentyl, tert-pentyl, neo-pentyl, or 3-pentyl, but may not be limited thereto.

In an embodiment of the present disclosure, in the above Chemical Formula 2, $R^3$ may be bulkier than $R^1$ and/or $R^2$, but may not be limited thereto.

In an embodiment of the present disclosure, in the above Chemical Formula 2, each of $R^1$ and $R^2$ may be independently methyl, ethyl, n-propyl, or iso-propyl, and $R^3$ may be iso-butyl, sec-butyl, or tert-butyl, but may not be limited thereto.

In an embodiment of the present disclosure, in the above Chemical Formula 2, each of $R^1$ and $R^2$ may be independently methyl or ethyl, and $R^3$ may be tert-butyl.

In an embodiment of the present disclosure, the aluminum-containing compound may be represented by the following Chemical Formula 3, but may not be limited thereto:

[Chemical Formula 3]

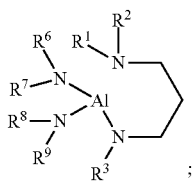

wherein, in the above Chemical Formula 3, each of R¹ to R³ is independently a linear or branched alkyl group having 1 to 5 carbon atoms, and each of R⁶ to R⁹ is independently a linear or branched alkyl group having 1 to 3 carbon atoms.

In an embodiment of the present disclosure, in the above Chemical Formula 3, each of R¹, R², and R³ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, and each of R⁶, R⁷, R⁸, and R⁹ may be independently methyl, ethyl, n-propyl, or iso-propyl, but may not be limited thereto.

In an embodiment of the present disclosure, in the above Chemical Formula 3, each of R¹ and R² may be independently methyl, ethyl, n-propyl, or iso-propyl, and R³ may be methyl, ethyl, n-propyl, iso-propyl, n-butyl, iso-butyl, sec-butyl, or tert-butyl, but may not be limited thereto.

In an embodiment of the present disclosure, in the above Chemical Formula 3, each of R¹ and R² may be independently methyl or ethyl, R³ may be tert-butyl, and each of R⁶, R⁷, R⁸, and R⁹ may be independently methyl or ethyl, but may not be limited thereto.

In an embodiment of the present disclosure, the aluminum-containing compound represented by the above Chemical Formula 2 or 3 may include the following compounds, but may not be limited thereto:

Dihydrido(3-dimethylaminopropyl(tert-butyl)amido)aluminum [H₂Al(NᵗBu(CH₂)₃NMe₂)];
Dihydrido(3-dimethylaminopropyl(isobutyl)amido)aluminum [H₂A(NⁱBu(CH₂)₃NMe₂)];
Dihydrido(3-dimethylaminopropyl(sec-butyl)amido)aluminum [H₂Al(NˢᵉᶜBu(CH₂)₃NMe₂)];
Dihydrido(3-dimethylaminopropyl(neopentyl)amido)aluminum [H₂Al(Nⁿᵉᵒ Pe(CH₂)₃NMe₂)];
Dihydrido(3-ethylmethylaminopropyl(tert-butyl)amido)aluminum [H₂Al(NᵗBu(CH₂)₃NEtMe)];
Dihydrido(3-diethylaminopropyl(tert-butyl)amido)aluminum [H₂Al(NᵗBu(CH₂)₃NEt₂)];
Bis(dimethylamido)(3-dimethylaminopropylethylamido) aluminum [(Me₂N)₂Al(NEt(CH₂)₃NMe₂)];
Bis(dimethylamido)(3-dimethylaminopropylisopropylamido)aluminum [(Me₂N)₂Al(NⁱPr(CH₂)₃NMe₂)];
Bis(ethylmethylamido)(3-dimethylaminopropylmethylamido)aluminum [(EtMeN)₂Al(NMe(CH₂)₃NMe₂)];
Bis(ethylmethylamido)(3-dimethylaminopropylethylamido)aluminum [(EtMeN)₂Al(NEt(CH₂)₃NMe₂)];
Bis(ethylmethylamido)(3-dimethylaminopropylisopropylamido)aluminum [(EtMeN)₂Al(NⁱPr(CH₂)₃NMe₂)];
Bis(diethylamido)(3-dimethylaminopropylmethylamido) aluminum [(Et₂N)₂Al(NMe(CH₂)₃NMe₂)];
Bis(diethylamido)(3-dimethylaminopropylethylamido)aluminum [(Et₂N)₂Al(NEt(CH₂)₃NMe₂)];
Bis(diethylamido)(3-dimethylaminopropylisopropylamido) aluminum [(Et₂N)₂Al(NⁱPr(CH₂)₃NMe₂)];
Bis(dimethylamido)(3-ethylmethylaminopropylmethylamido)aluminum [(Me₂N)₂Al(NMe(CH₂)₃NEtMe)];
Bis(dimethylamido)(3-ethylmethylaminopropylethylamido) aluminum [(Me₂N)₂Al(NEt(CH₂)₃NEtMe)];
Bis(ethylmethylamido)(3-ethylmethylaminopropylmethylamido)aluminum [(EtMeN)₂Al(NMe(CH₂)₃NEtMe)];
Bis(ethylmethylamido)(3-ethylmethylaminopropylethylamido)aluminum [(EtMeN)₂Al(NEt(CH₂)₃NEtMe)];
Bis(diethylamido)(3-ethylmethylaminopropylmethylamido) aluminum [(Et₂N)₂Al(NMe(CH₂)₃NEtMe)];
Bis(diethylamido)(3-ethylmethylaminopropylethylamido) aluminum [(Et₂N)₂Al(NEt(CH₂)₃NEtMe)];
Bis(dimethylamido)(3-diethylaminopropylmethylamido) aluminum [(Me₂N)₂Al(NMe(CH₂)₃NEt₂)];
Bis(dimethylamido)(3-diethylaminopropylethylamido)aluminum [(Me₂N)₂Al(NEt(CH₂)₃NEt₂)];
Bis(ethylmethylamido)(3-diethylaminopropylmethylamido) aluminum [(EtMeN)₂Al(NMe(CH₂)₃NEt₂)]; and
Bis(ethylmethylamido)(3-diethylaminopropylethylamido) aluminum [(EtMeN)₂Al(NEt(CH₂)₃NEt₂)].

In an embodiment of the present disclosure, the aluminum-containing compound represented by the above Chemical Formula 2 may include at least one selected from H₂Al[NᵗBu(CH₂)₃NMe₂], H₂Al[NⁱBu(CH₂)₃NMe₂], H₂Al[Nˢᵉᶜ Bu(CH₂)₃NMe₂], H₂Al[Nⁿᵉᵒ Pe(CH₂)₃NMe₂], H₂Al[NᵗBu(CH₂)₃NEtMe], and H₂Al[NᵗBu(CH₂)₃NEt₂], but may not be limited thereto.

In an embodiment of the present disclosure, the aluminum-containing compound represented by the above Chemical Formula 2 may be dihydrido(3-dimethylaminopropyl (tert-butyl)amido)aluminum [H₂Al(NᵗBu(CH₂)₃NMe₂)].

In an embodiment of the present disclosure, the aluminum-containing compound represented by the above Chemical Formula 3 may include at least one selected from [(Me₂N)₂Al(NEt(CH₂)₃NMe₂)], [(Me₂N)₂Al(NⁱPr(CH₂)₃NMe₂)], [(EtMeN)₂Al(NMe(CH₂)₃NMe₂)], [(EtMeN)₂Al(NEt(CH₂)₃NMe₂)], [(EtMeN)₂A(NⁱPr(CH₂)₃NMe₂)], [(Et₂N)₂Al(NMe(CH₂)₃NMe₂)], [(Et₂N)₂Al(NEt(CH₂)₃NMe₂)], [(Et₂N)₂Al(NⁱPr(CH₂)₃NMe₂)], [(Me₂N)₂Al(NMe (CH₂)₃NEtMe)], [(Me₂N)₂Al(NEt(CH₂)₃NEtMe)], [(EtMeN)₂Al(NMe(CH₂)₃NEtMe)], [(EtMeN)₂Al(NEt(CH₂)₃NEtMe)], [(Et₂N)₂Al(NMe(CH₂)₃NEtMe)], [(Et₂N)₂Al(NEt(CH₂)₃NEtMe)], [(Me₂N)₂Al(NMe(CH₂)₃NEt₂)], [(Me₂N)₂Al(NEt(CH₂)₃NEt₂)], [(EtMeN)₂Al(NMe(CH₂)₃NEt₂)], and [(EtMeN)₂Al(NEt(CH₂)₃NEt₂)], but may not be limited thereto.

In an embodiment of the present disclosure, the aluminum-containing compound represented by the above Chemical Formula 3 may be [Me₂N(CH₂)₃NMe]Al(NEtMe)₂ or [Me₂N(CH₂)₃NMe]Al(NEt₂)₂.

A second aspect of the present disclosure provides a method of preparing an aluminum-containing compound of the first aspect of the present disclosure represented by the following Chemical Formula 2, including: reacting AlH₃ with a dialkylaminopropylalkylamine represented by the following Chemical Formula 4:

[Chemical Formula 4]

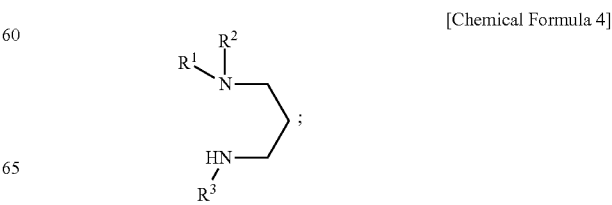

[Chemical Formula 2]

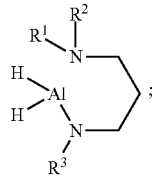

wherein, in the above Chemical Formulas 2 and 4, each of $R^1$ and $R^2$ is independently a linear or branched alkyl group having 1 to 5 carbon atoms, and $R^3$ is a linear or branched alkyl group having 4 or 5 carbon atoms.

Detailed descriptions on the second aspect of the present disclosure, which overlaps with those on the first aspect of the present disclosure, are omitted hereinafter, but the descriptions on the first aspect of the present disclosure may be identically applied to the second aspect of the present disclosure, even though they are omitted hereinafter.

In an embodiment of the present disclosure, in the above Chemical Formulas 2 and 4, each of $R^1$ and $R^2$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, and $R^3$ may be independently iso-butyl, sec-butyl, tert-butyl, n-pentyl, iso-pentyl, sec-pentyl, tert-pentyl, neo-pentyl, or 3-pentyl, but may not be limited thereto.

In an embodiment of the present disclosure, in the above Chemical Formulas 2 and 4, $R^3$ may be bulkier than $R^1$ and/or $R^2$, but may not be limited thereto.

In an embodiment of the present disclosure, in the above Chemical Formulas 2 and 4, each of $R^1$ and $R^2$ may be independently methyl, ethyl, n-propyl, or iso-propyl, and $R^3$ may be independently iso-butyl, sec-butyl, or tert-butyl, but may not be limited thereto.

In an embodiment of the present disclosure, a method of preparing an aluminum-containing compound represented by the above Chemical Formula 2 may include: $LiAlH_4$ may be dissolved in an organic solvent (non-limiting example: ether, diethyl ether, etc.) under an inert gas atmosphere and then an $AlX_3$ solution dissolved in an organic solvent may be dropwisely added under stirring to obtain a reaction mixture containing $AlH_3$. Herein, X is a halogen atom and may be at least one selected from Cl, Br, and I. The as-prepared $AlH_3$ may be present in the form of a complex coordinated by the organic solvent (non-limiting example: ether, diethyl ether, etc.), but may not be limited thereto. The dialkylaminopropylalkylamine represented by the above Chemical Formula 4 may be slowly dropwisely added to the reaction mixture under stirring and then filtered and vacuum-distilled to obtain an aluminum-containing compound represented by the above Chemical Formula 2.

A third aspect of the present disclosure provides a method of preparing an aluminum-containing compound of the first aspect of the present disclosure represented by the following Chemical Formula 3, including: reacting $AlX_3$ sequentially with an alkali metal salt of a dialkylaminopropylalkylamine represented by the following Chemical Formula 4 and an alkali metal salt of a dialkylamine:

[Chemical Formula 4]

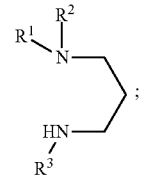

[Chemical Formula 3]

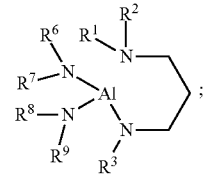

wherein the dialkylamine is represented by $NHR^6R^7$ and $NHR^8R^9$;

wherein, in the above Chemical Formulas 3 and 4 and the dialkylamine, each of $R^1$ to $R^3$ is independently a linear or branched alkyl group having 1 to 5 carbon atoms, each of $R^6$ to $R^9$ is independently a linear or branched alkyl group having 1 to 3 carbon atoms, and the above $NHR^6R^7$ and $NHR^8R^9$ are the same or different to each other; and wherein, in the above $AlX_3$, X is a halogen atom.

Detailed descriptions on the third aspect of the present disclosure, which overlaps with those on the first and second aspects of the present disclosure, are omitted hereinafter, but the descriptions on the first and second aspects of the present disclosure may be identically applied to the third aspect of the present disclosure, even though they are omitted hereinafter.

In an embodiment of the present disclosure, in the above Chemical Formulas 3 and 4, each of $R^1$, $R^2$, and $R^3$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, but may not be limited thereto.

In an embodiment of the present disclosure, in the above Chemical Formulas 3 and 4, each of $R^1$ and $R^2$ may be independently methyl, ethyl, n-propyl, or iso-propyl, and each of $R^3$ may be independently methyl, ethyl, n-propyl, iso-propyl, n-butyl, iso-butyl, sec-butyl, or tert-butyl, but may not be limited thereto.

In an embodiment of the present disclosure, in the above Chemical Formula 3 and the dialkylamine, each of $R^6$, $R^7$, $R^8$, and $R^9$ may be independently methyl, ethyl, n-propyl, or iso-propyl, but may not be limited thereto.

In an embodiment of the present disclosure, the dialkylamine may include dimethylamine, ethylmethylamine, diethylamine, methylpropylamine, ethylpropylamine, and dipropylamine, but may not be limited thereto.

In an embodiment of the present disclosure, the above X is a halogen atom and may be Cl, Br, or I, and for example, the above $AlX_3$ may be $AlCl_3$, $AlBr_3$, or $AlI_3$.

In an embodiment of the present disclosure, a method of preparing an aluminum-containing compound represented by the above Chemical Formula 3 may include:

(1) Preparation of an Alkali Metal Salt of Dialkylaminopropylalkylamine Represented by the Above Chemical Formula 4

An alkali metal salt (non-limiting example, n-BuLi, etc.) may be dissolved in an organic solvent (non-limiting example: n-hexane, etc.) under an inert gas atmosphere and then a dialkylaminopropylalkylamine represented by the above Chemical Formula 4 may be slowly, dropwisely added thereto under stirring to prepare an alkali metal salt of the dialkylaminopropylalkylamine represented by the above Chemical Formula 4.

(2) Preparation of an Alkali Metal Salt of Dialkylamine

An alkali metal salt (non-limiting example, n-BuLi, etc.) may be dissolved in an organic solvent (non-limiting example: n-hexane solvent, etc.) and then a dialkylamine may be slowly, dropwisely added thereto under stirring to prepare an alkali metal salt of the dialkylamine.

(3) Preparation of an Aluminum-Containing Compound Represented by the Above Chemical Formula 3

$AlX_3$ may be dissolved in an organic solvent (non-limiting example: ether, diethyl ether, etc.) under stirring and the alkali metal salt of the dialkylaminopropylalkylamine represented by the above Chemical Formula 4 may be slowly, dropwisely added thereto under stirring to prepare a reaction mixture. Herein, the above X is a halogen atom and may be selected from Cl, Br, and I. The alkali metal salt of the dialkylamine may be slowly, dropwisely added to the reaction mixture under stirring and then filtered and vacuum-distilled to obtain an aluminum-containing compound represented by the above Chemical Formula 3.

A fourth aspect of the present disclosure provides a precursor composition for forming a film, including an aluminum-containing precursor compound represented by the following Chemical Formula 1:

[Chemical Formula 1]

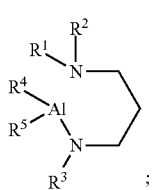

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

Detailed descriptions on the fourth aspect of the present disclosure, which overlaps with those on the first to third aspects of the present disclosure, are omitted hereinafter, but the descriptions on the first to third aspects of the present disclosure may be identically applied to the fourth aspect of the present disclosure, even though they are omitted hereinafter.

In an embodiment of the present disclosure, in the above Chemical Formula 1, when $R^4$ is an alkylamino group, it may be represented by —$NR^6R^7$, and when $R^5$ is an alkylamino group, it may be represented by —$NR^8R^9$, wherein, each of $R^6$, $R^7$, $R^8$, and $R^9$ may be independently a linear or branched alkyl group having 1 to 3 carbon atoms, and $R^6$, $R^7$, $R^8$, and $R^9$ may be the same or different to another, but may not be limited thereto.

In an embodiment of the present disclosure, in the above Chemical Formula 1, each of $R^1$, $R^2$, and $R^3$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, and each of $R^6$, $R^7$, $R^8$, and $R^9$ may be independently methyl, ethyl, n-propyl, or iso-propyl, but may not be limited thereto.

In an embodiment of the present disclosure, in the above Chemical Formula 1, each of $R^1$ and $R^2$ may be independently methyl, ethyl, n-propyl, or iso-propyl, and $R^3$ may be methyl, ethyl, n-propyl, iso-propyl, n-butyl, iso-butyl, sec-butyl, or tert-butyl, but may not be limited thereto.

In an embodiment of the present disclosure, in the above Chemical Formula 1, each of $R^1$ and $R^2$ may be independently methyl or ethyl, and $R^3$ may be tert-butyl.

In an embodiment of the present disclosure, in the above Chemical Formula 1, each of $R^6$, $R^7$, $R^8$, and $R^9$ may be independently methyl or ethyl, but may not be limited thereto.

In an embodiment of the present disclosure, the precursor composition for forming a film may be used to form an aluminum metal film, an aluminum oxide film, or an aluminum nitride film, but may not be limited thereto. In an embodiment of the present disclosure, the precursor composition for forming a film may be used to form an aluminum nitride film.

In an embodiment of the present disclosure, the aluminum-containing precursor compound may include at least one selected from $H_2A(N^tBu(CH_2)_3NMe_2)$, $H_2Al(N^iBu(CH_2)_3NMe_2)$, $H_2Al(N^{sec}Bu(CH_2)_3NMe_2)$, $H_2Al(N^{neo}Pe(CH_2)_3NMe_2)$, $H_2Al(N^tBu(CH_2)_3NEtMe)$, and $H_2Al(N^tBu(CH_2)_3NEt_2)$, but may not be limited thereto. The aluminum-containing precursor compound may be $H_2Al(N^tBu(CH_2)_3NMe_2)$.

In an embodiment of the present disclosure, the aluminum-containing precursor compound may include at least one selected from $[(Me_2N)_2Al(NEt(CH_2)_3NMe_2)]$, $[(Me_2N)_2Al(N^iPr(CH_2)_3NMe_2)]$, $[(EtMeN)_2Al(NMe(CH_2)_3NMe_2)]$, $[(EtMeN)_2Al(NEt(CH_2)_3NMe_2)]$, $[(EtMeN)_2Al(N^iPr(CH_2)_3NMe_2)]$, $[(Et_2N)_2Al(NMe(CH_2)_3NMe_2)]$, $[(Et_2N)_2Al(NEt(CH_2)_3NMe_2)]$, $[(Et_2N)_2Al(N^iPr(CH_2)_3NMe_2)]$, $[(Me_2N)_2Al(NMe(CH_2)_3NEtMe)]$, $[(Me_2N)_2Al(NEt(CH_2)_3NEtMe)]$, $[(EtMeN)_2Al(NMe(CH_2)_3NEtMe)]$, $[(EtMeN)_2Al(NEt(CH_2)_3NEtMe)]$, $[(Et_2N)_2Al(NMe(CH_2)_3NEtMe)]$, $[(Et_2N)_2Al(NEt(CH_2)_3NEtMe)]$, $[(Me_2N)_2Al(NMe(CH_2)_3NEt_2)]$, $[(Me_2N)_2Al(NEt(CH_2)_3NEt_2)]$, $[(EtMeN)_2Al(NMe(CH_2)_3NEt_2)]$, and $[(EtMeN)_2Al(NEt(CH_2)_3NEt_2)]$, but may not be limited thereto. In an embodiment of the present disclosure, the aluminum-containing precursor compound may be $(EtMeN)_2Al(NMe(CH_2)_3NMe_2)$ or $(Et_2N)_2Al(NMe(CH_2)_3NMe_2)$.

In an embodiment of the present disclosure, the aluminum-containing precursor compound may be liquid at room temperature.

In an embodiment of the present disclosure, the precursor composition for forming a film may be used to obtain a uniformly formed aluminum-containing film, and more specifically, a uniformly formed aluminum-containing film can be obtained even on a substrate including fine trenches. From the results of a transmission electron microscope (TEM) observation on the cross-section of an aluminum-containing film uniformly formed using the precursor composition for forming a film of an embodiment of the present disclosure, it can be seen that the film having a uniform thickness is formed on the deepest portions and tops of the trenches. For example, even if a substrate includes fine corrugations (trenches) having an aspect ratio of about 1 or more and a width of about 1 μm or less, the film having a uniform thickness can be formed. For example, the aspect ratio may be about 1 or more, about 2 or more, about 3 or more, about 4 or more, about 5 or more, about 6 or more, about 7 or more, about 8 or more, about 9 or more, or about 10 or more, and the width may be about 1 μm or less, about 500 nm or less, about 100 nm or less, or about 50 nm or less, but may not be limited thereto. For example, the precursor composition for forming a film of an embodiment of the present disclosure may be used to form a film having a uniform thickness in a narrow trench having an aspect ratio of about 10:1 by ALD, which may mean that the aluminum-containing precursor compound contained in the precursor composition for forming a film has high thermal stability.

In an embodiment of the present disclosure, the precursor composition for forming a film may further include at least one nitrogen source selected from ammonia, nitrogen, hydrazine, and dimethyl hydrazine, but may not be limited thereto.

In an embodiment of the present disclosure, the formation or deposition of the aluminum-containing film may be performed in the presence or absence of at least one nitrogen source selected from ammonia, nitrogen, hydrazine, and dimethyl hydrazine.

In an embodiment of the present disclosure, the precursor composition for forming a film may further include at least one oxygen source selected from oxygen, ozone, water, and $H_2O_2$, but may not be limited thereto.

A fifth aspect of the present disclosure provides a method of forming an aluminum-containing film, including: forming the aluminum-containing film using the precursor composition for forming a film of the fourth aspect of the present disclosure including an aluminum-containing precursor compound represented by the following Chemical Formula 1:

[Chemical Formula 1]

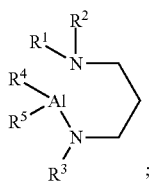

wherein, in the above Chemical Formula 1, each of $R^1$ to $R^3$ is independently a linear or branched alkyl group having 1 to 5 carbon atoms, and each of $R^4$ and $R^5$ is independently hydrogen, or an alkylamino group containing at least one linear or branched alkyl group having 1 to 6 carbon atoms.

Detailed descriptions on the fifth aspect of the present disclosure, which overlaps with those on the first to fourth aspects of the present disclosure, are omitted hereinafter, but the descriptions on the first to fourth aspects of the present disclosure may be identically applied to the fifth aspect of the present disclosure, even though they are omitted hereinafter.

In an embodiment of the present disclosure, in the above Chemical Formula 1, when $R^4$ is an alkylamino group, it may be represented by —$NR^6R^7$, and when $R^5$ is an alkylamino group, it may be represented by —$NR^8R^9$, wherein, each of $R^6$, $R^7$, $R^8$, and $R^9$ may be independently a linear or branched alkyl group having 1 to 3 carbon atoms, and $R^6$, $R^7$, $R^8$, and $R^9$ may be the same or different to another, but may not be limited thereto.

In an embodiment of the present disclosure, in the above Chemical Formula 1, each of $R^1$, $R^2$, and $R^3$ may be independently methyl, ethyl, n-propyl, iso-propyl, n-butyl, iso-butyl, sec-butyl, tert-butyl, n-pentyl, iso-pentyl, sec-pentyl, tert-pentyl, neo-pentyl, or 3-pentyl, and each of $R^6$, $R^7$, $R^8$, and $R^9$ may be independently methyl, ethyl, n-propyl, or iso-propyl, but may not be limited thereto.

In an embodiment of the present disclosure, in the above Chemical Formula 1, each of $R^1$ and $R^2$ may be independently methyl, ethyl, n-propyl, or iso-propyl, and $R^3$ may be methyl, ethyl, n-propyl, iso-propyl, n-butyl, iso-butyl, sec-butyl, or tert-butyl, but may not be limited thereto.

In an embodiment of the present disclosure, in the above Chemical Formula 1, each of $R^1$ and $R^2$ may be independently methyl or ethyl, and $R^3$ may be tert-butyl.

In an embodiment of the present disclosure, in the above Chemical Formula 1, each of $R^6$, $R^7$, $R^8$, and $R^9$ may be independently methyl or ethyl, but may not be limited thereto.

In an embodiment of the present disclosure, the aluminum-containing precursor compound may include at least one selected from $H_2Al(N^tBu(CH_2)_3NMe_2)$, $H_2Al(N^iBu(CH_2)_3NMe_2)$, $H_2Al(N^{sec}Bu(CH_2)_3NMe_2)$, $H_2Al(N^{neo}Pe(CH_2)_3NMe_2)$, $H_2Al(N^tBu(CH_2)_3NEtMe)$, and $H_2Al(N^tBu(CH_2)_3NEt_2)$, but may not be limited thereto. The aluminum-containing precursor compound may be $H_2Al(N^tBu(CH_2)_3NMe_2)$.

In an embodiment of the present disclosure, the aluminum-containing precursor compound may include at least one selected from $[(Me_2N)_2Al(NEt(CH_2)_3NMe_2)]$, $[(Me_2N)_2Al(N^iPr(CH_2)_3NMe_2)]$, $[(EtMeN)_2Al(NMe(CH_2)_3NMe_2)]$, $[(EtMeN)_2Al(NEt(CH_2)_3NMe_2)]$, $[(EtMeN)_2Al(N^iPr(CH_2)_3NMe_2)]$, $[(Et_2N)_2Al(NMe(CH_2)_3NMe_2)]$, $[(Et_2N)_2Al(NEt(CH_2)_3NMe_2)]$, $[(Et_2N)_2Al(N^iPr(CH_2)_3NMe_2)]$, $[(Me_2N)_2Al(NMe(CH_2)_3NEtMe)]$, $[(Me_2N)_2Al(NEt(CH_2)_3NEtMe)]$, $[(EtMeN)_2Al(NMe(CH_2)_3NEtMe)]$, $[(EtMeN)_2Al(NEt(CH_2)_3NEtMe)]$, $[(Et_2N)_2Al(NMe(CH_2)_3NEtMe)]$, $[(Et_2N)_2Al(NEt(CH_2)_3NEtMe)]$, $[(Me_2N)_2Al(NMe(CH_2)_3NEt_2)]$, $[(Me_2N)_2Al(NEt(CH_2)_3NEt_2)]$, $[(EtMeN)_2Al(NMe(CH_2)_3NEt_2)]$, and $[(EtMeN)_2Al(NEt(CH_2)_3NEt_2)]$, but may not be limited thereto.

In an embodiment of the present disclosure, the aluminum-containing precursor compound may be $(EtMeN)_2Al(NMe(CH_2)_3NMe_2)$ or $(Et_2N)_2Al(NMe(CH_2)_3NMe_2)$.

In an embodiment of the present disclosure, the precursor composition for forming a film may be used to form an aluminum metal film, an aluminum oxide film, or an aluminum nitride film, but may not be limited thereto. In an embodiment of the present disclosure, the precursor composition for forming a film may be used to form an aluminum nitride film.

In an embodiment of the present disclosure, the aluminum-containing film may be formed or deposited by CVD or ALD, but may not be limited thereto. The aluminum-containing film may be formed or deposited by ALD, but may not be limited thereto. It is advantageous that the aluminum-containing film may be formed or deposited by thermal ALD without using plasma.

In an embodiment of the present disclosure, the aluminum-containing film may be typically formed or deposited in a deposition chamber designed for CVD or ALD, but may not be limited thereto. Particularly, in an embodiment of the present disclosure, the aluminum-containing film may be formed or deposited in a deposition chamber typically designed for thermal atomic layer deposition.

In an embodiment of the present disclosure, the aluminum-containing precursor compound may be liquid at room temperature.

In an embodiment of the present disclosure, the precursor composition for forming a film may further include at least one nitrogen source selected from ammonia, nitrogen, hydrazine, and dimethyl hydrazine, but may not be limited thereto.

In an embodiment of the present disclosure, the formation or deposition of the aluminum-containing film may be performed in the presence or absence of at least one nitrogen source selected from ammonia, nitrogen, hydrazine, and dimethyl hydrazine.

In an embodiment of the present disclosure, the precursor composition for forming a film may further include at least one oxygen source selected from oxygen, ozone, water, and $H_2O_2$, but may not be limited thereto.

In an embodiment of the present disclosure, when the precursor composition for forming a film including the aluminum-containing precursor compound is used to form an aluminum-containing film by ALD or thermal ALD, the film growth per ALD gas supply cycle can be maintained relatively uniformly. In an embodiment of the present disclosure, when the precursor composition for forming a film including the aluminum-containing precursor compound is used to form an aluminum metal film, an aluminum oxide film, or an aluminum nitride film by ALD or thermal ALD, the film growth per ALD gas supply cycle can be maintained relatively uniformly. In an embodiment of the present disclosure, when the precursor composition for forming a film including the aluminum-containing precursor compound is used to form an aluminum nitride film by ALD or thermal ALD, the film growth per ALD gas supply cycle can be maintained relatively uniformly in spite of changes in substrate temperature and the film growth is not increased even when the supply time of the aluminum-containing precursor compound is increased in the ALD gas supply cycle.

In an embodiment of the present disclosure, when the aluminum-containing film is formed, the substrate temperature may be maintained in the range of from about 200° C. to about 520° C., from about 250° C. to about 500° C., from about 250° C. to about 450° C., from about 250° C. to about 400° C., or from about 300° C. to about 400° C., but may not be limited thereto. Further, when the aluminum-containing film is formed, the substrate temperature may be maintained in the range of from about 300° C. to about 400° C. In an embodiment of the present disclosure, according to the method of forming an aluminum-containing film, the film growth per ALD gas supply cycle can be maintained relatively uniformly at the substrate temperature ranging from about 300° C. to about 400° C.

In an embodiment of the present disclosure, the precursor composition for forming a film may be used to obtain a uniformly formed aluminum-containing film, and more specifically, a uniformly formed aluminum-containing film can be obtained even on a substrate including fine trenches. From the results of a transmission electron microscope (TEM) observation on the cross-section of an aluminum-containing film uniformly formed using the precursor composition for forming a film of an embodiment of the present disclosure, it can be seen that the film having a uniform thickness is formed on the deepest portions and tops of the trenches. For example, even if a substrate includes fine corrugations (trenches) having an aspect ratio of about 1 or more and a width of about 1 μm or less, the film having a uniform thickness can be formed on the substrate. For example, the aspect ratio may be about 1 or more, about 2 or more, about 3 or more, about 5 or more, about 10 or more, about 20 or more, about 30 or more, about 50 or more, about 70 or more, or about 100 or more, and the width may be about 1 μm or less, about 500 nm or less, about 100 nm or less, or about 50 nm or less, but may not be limited thereto. For example, the precursor composition for forming a film of an embodiment of the present disclosure may be used to form a film having a uniform thickness in a narrow trench having an aspect ratio of about 10:1 by ALD, which may mean that the aluminum-containing precursor compound contained in the precursor composition for forming a film has high thermal stability.

Hereinafter, the present disclosure will be explained in more detail with reference to Examples. However, the following Examples are illustrative only for better understanding of the present disclosure but do not limit the present disclosure.

MODE FOR CARRYING OUT THE INVENTION

Examples

<Example 1> Preparation of Liquid Compound $H_2Al(N^tBu(CH_2)_3NMe_2)$ 10.5 g (0.263 mol) of $LiAlH_4$ was put into a 1-L Schlenk flask under argon gas atmosphere and then 200 mL of diethyl ether $[(C_2H_5)_2O]$ was added thereto and then cooled to 0° C. After 11.6 g (0.0809 mol) of $AlCl_3$ dissolved in 100 mL of diethyl ether$[(C_2H_5)_2O]$ was dropwisely added to the flask, the temperature of the reaction solution was slowly raised to room temperature and then the reaction solution was stirred for 1 hour to prepare $AlH_3(Et_2O)_x$. Then, the flask was cooled again to −30° C. and 50 g (0.316 mol) of $Me_2N(CH_2)_3NH^tBu$ was slowly, dropwisely added to the flask, and the mixture was stirred for 14 hours at room temperature. After the reaction was completed, filtration was performed using a glass frit and the filtrate was subject to reduced pressure of 0.25 torr to remove the solvent therefrom and then distilled to obtain 46 g (yield of 94%) of a transparent compound which is liquid at room temperature, as represented by Chemical Formula 5.

[Chemical Formula 5]

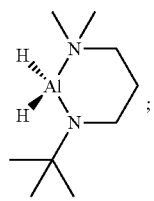

Boiling point (b.p.): 80° C. (0.3 torr);
Elemental analysis
calculated for $(C_9H_{23}N_2Al)$: C, 58.03, H, 12.45, N, 15.04. Found C, 57.97, H, 12.48, N, 15.01.
$^1$H-NMR (400 MHz, $C_6D_6$, 25° C.): δ 3.016 (t, 2H, $(CH_3)_2N(CH_2CH_2C\underline{H}_2)NC(CH_3)_3$), 2.044 (t, 2H, $(CH_3)_2N(C\underline{H}_2CH_2CH_2)NC(CH_3)_3$), 1.914 (s, 6H, $(C\underline{H}_3)_2N(CH_2CH_2CH_2)NC(CH_3)_3$), 1.335 (s, 9H, $(C\underline{H}_3)_2N(CH_2CH_2CH_2)NC(C\underline{H}_3)_3$), 1.242 (m, 2H, $(CH_3)_2N(CH_2CH_2CH_2)NC(C\underline{H}_3)_3$).

<Example 2> Preparation of Liquid Compound $(EtMeN)_2Al(NMe(CH_2)_3NMe_2)$

After n-BuLi (81.02 g, 0.291 mol) and 300 mL of n-hexane were put into a 500-mL Schlenk flask under argon gas atmosphere and cooled to −15° C., $Me_2N(CH_2)_3NHMe$ (33.8 g, 0.291 mol) was slowly, dropwisely added thereto and the temperature of the reaction solution was slowly raised to room temperature and then the reaction solution was stirred for 4 hours to synthesize $[Me_2N(CH_2)_3NMe]^-Li^+$ solution.

After n-BuLi (121.53 g, 0.4363 mol) and 500 mL of n-hexane were put into a 1-L Schlenk flask and cooled to −15° C., EtMeNH (25.79 g, 0.4363 mol) was slowly dropwisely added thereto and the temperature of the reaction solution was slowly raised to room temperature and then the reaction solution was stirred for 4 hours to synthesize [EtMeN]$^-$Li$^+$ solution.

AlCl$_3$ was put into a 2-L Schlenk flask and cooled to −15° C. and then 500 mL of diethyl ether [(C$_2$H$_5$)$_2$O] was added thereto, and the temperature of the reaction solution was slowly raised to room temperature and then the reaction solution was stirred for 2 hours. The reaction solution was cooled again to −15° C. and the [Me$_2$N(CH$_2$)$_3$NMe]$^-$Li$^+$ solution was slowly, dropwisely added thereto under stirring. After the dropwise addition, the temperature of the reaction solution was slowly raised to room temperature and then the reaction solution was stirred for about 14 hours. Then, the solution was cooled to −15° C. and the [EtMeN]$^-$Li$^+$ solution was slowly, dropwisely added thereto under stirring. Then, the temperature of the reaction solution was slowly raised to room temperature and then the reaction solution was stirred for about 14 hours.

After the reaction was completed, filtration was performed using a glass frit and the filtrate was subject to reduced pressure of 0.3 torr to remove the solvent therefrom and then distilled to obtain 38 g (yield of 60%) of a yellow compound which is liquid at room temperature, as represented by Chemical Formula 6.

[Chemical Formula 6]

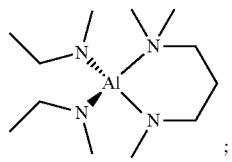

;

Boiling point (b.p.): 90° C. (0.25 torr);
Elemental analysis
calculated for (C$_{12}$H$_{31}$N$_4$Al): C, 55.78, H, 12.09, N, 21.68.
Found C, 55.68, H, 12.02, N, 21.75.
$^1$H-NMR (400 MHz, C$_6$D$_6$, 25° C.): δ 3.166 (m, 2H, N—C$\underline{H}_2$CH$_3$), 3.045 (m, 2H, N—C$\underline{H}_2$CH$_3$), 2.962 (t, 2H, (CH$_3$)$_2$N—CH$_2$CH$_2$C$\underline{H}_2$—NCH$_3$), 2.877 (s, 3H, (CH$_3$)$_2$N—CH$_2$CH$_2$CH$_2$—NC$\underline{H}_3$), 2.807 (s, 6H, N—C$\underline{H}_3$), 2.044 (t, 2H, (CH$_3$)$_2$N—C$\underline{H}_2$CH$_2$CH$_2$—NCH$_3$), 1.845 (s, 6H, (C$\underline{H}_3$)$_2$N—CH$_2$CH$_2$CH$_2$—NCH$_3$), 1.405 (m, 2H, N—(CH$_3$)$_2$N—CH$_2$C$\underline{H}_2$CH$_2$—NCH$_3$). 1.269 (t, 6H, N—CH$_2$C$\underline{H}_3$).

<Example 3> Preparation of Liquid Compound (Et$_2$N)$_2$Al(NMe(CH$_2$)$_3$NMe$_2$)

After n-BuLi (81.02 g, 0.291 mol) and 300 mL of n-hexane were put into a 500-mL Schlenk flask under argon gas atmosphere and cooled to −15° C., Me$_2$N(CH$_2$)$_3$NHMe (33.8 g, 0.291 mol) was slowly dropwise added thereto and the temperature of the reaction solution was slowly raised to room temperature and then the reaction solution was stirred for 4 hours to synthesize [Me$_2$N(CH$_2$)$_3$NMe]$^-$Li$^+$ solution.

After n-BuLi (121.53 g, 0.436 mol) and 500 mL of n-hexane were put into a 1-L Schlenk flask and cooled to −15° C., Et$_2$NH (25.79 g, 0.436 mol) was slowly, dropwisely added thereto and the temperature of the reaction solution was slowly raised to room temperature and then the reaction solution was stirred for 4 hours to synthesize [Et$_2$N]$^-$Li$^+$ solution.

AlCl$_3$ was put into a 2-L Schlenk flask and cooled to −15° C. and then 500 mL of diethyl ether [(C$_2$H$_5$)$_2$O] was added thereto, and the temperature of the reaction solution was slowly raised to room temperature and then the reaction solution was stirred for 2 hours. The reaction solution was cooled again to −15° C. and the [Me$_2$N(CH$_2$)$_3$NMe]$^-$Li$^+$ solution was slowly, dropwisely added thereto under stirring. After the dropwise addition, the temperature of the reaction solution was slowly raised to room temperature and then the reaction solution was stirred for about 14 hours. Then, the solution was cooled to −15° C. and the [Et$_2$N]$^-$Li$^+$ solution was slowly, dropwisely added thereto under stirring. Then, the temperature of the reaction solution was slowly raised to room temperature and then the reaction solution was stirred for about 14 hours.

After the reaction was completed, filtration was performed using a glass frit and the filtrate was subject to reduced pressure of 0.3 torr to remove the solvent therefrom and then distilled to obtain 33.69 g (yield of 53.8%) of a yellow compound which is liquid at room temperature, as represented by Chemical Formula 7.

[Chemical Formula 7]

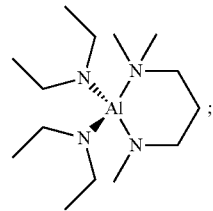

;

Boiling point (b.p.): 95° C. (0.25 torr);
Elemental analysis
calculated for (C$_{14}$H$_{35}$N$_4$Al): C, 60.12, H, 12.89, N, 19.48.
Found C, 60.07, H, 12.82, N, 19.56.
$^1$H-NMR (400 MHz, C$_6$D$_6$, 25° C.): δ 3.127 (m, 8H, N—C$\underline{H}_2$CH$_3$), 2.950 (t, 2H, (CH$_3$)$_2$N—CH$_2$CH$_2$C$\underline{H}_2$—NCH$_3$), 2.888 (s, 3H, (CH$_3$)$_2$N—CH$_2$CH$_2$CH$_2$—NC$\underline{H}_3$), 2.100 (t, 2H, (CH$_3$)$_2$N—CH$_2$CH$_2$CH$_2$—NCH$_3$), 1.890 (s, 6H, (C$\underline{H}_3$)$_2$N—CH$_2$CH$_2$CH$_2$—NCH$_3$), 1.405 (m, 2H, N—(CH$_3$)$_2$N—CH$_2$C$\underline{H}_2$CH$_2$—NCH$_3$). 1.234 (t, 12H, N—CH$_2$C$\underline{H}_3$).

<Example 4> Evaluation of Thermal Stability of Liquid Compound H$_2$Al(N$^t$Bu(CH$_2$)$_3$NMe$_2$)

The thermal stability of the compound H$_2$Al(N$^t$Bu(CH$_2$)$_3$NMe$_2$) prepared according to Example 1 using the apparatus shown in FIG. 1 was evaluated. While a source canister which 50 g of H$_2$Al(N$^t$Bu(CH$_2$)$_3$NMe$_2$) was put into was maintained at a temperature of 60° C., argon (Ar) carrier gas was allowed to pass through the canister at a flow rate of 100 sccm under reduced pressure. The gas containing the compound H$_2$Al(N$^t$Bu(CH$_2$)$_3$NMe$_2$) from the source canister was collected in each of receiver canisters 1, 2, and 3 which had been cooled with dry ice for 0 to 4 weeks, 5 to 8 weeks, and 9 to 12 weeks, respectively so as to check changes in their states or colors and measure NMR spectra. All the materials collected in the receiver canisters 1, 2, and 3 were a transparent liquid and remained in the same state as prior to being put into the source canister, and the purities calculated from the peak areas in the NMR spectra were not changed or not significantly changed for 12 weeks as shown in Table 1 below. Therefore, it can be seen that the compound $H_2Al(N^tBu(CH_2)_3NMe_2)$ prepared according to Example 1 has sufficiently high thermal stability to be used for CVD or ALD precursor.

TABLE 1

| | NMR purity |
|---|---|
| Before being put into the source canister | 99.8% |
| Receiver canister 1 (0 to 4 weeks) | 99.8% |
| Receiver canister 2 (5 to 8 weeks) | 99.8% |
| Receiver canister 3 (9 to 12 weeks) | 99.3% |
| source canister 60° C., after 12 weeks | 99.3% |

<Example 5> Formation of Aluminum Nitride (AlN) Thin Film Using Liquid Compound $H_2Al$ $(N^tBu(CH_2)_3NMe_2)$ and Ammonia ($NH_3$)

An aluminum nitride thin film was formed by ALD on a silicon wafer or substrate including very narrow trenches having an aspect ratio of about 10:1 and a TiN film on the surface using the compound $H_2Al(N^tBu(CH_2)_3NMe_2)$ prepared according to Example 1 as a precursor and ammonia ($NH_3$) as a reaction gas. The substrate was heated to a temperature of 300° C. or 325° C., and $H_2Al(N^tBu(CH_2)_3NMe_2)$ was put in a stainless-steel container was heated to a temperature of 65° C. and then supplied to an ALD reactor using argon (Ar) carrier gas. Ammonia was supplied into the ALD reactor at a flow rate of 200 sccm.

Figure 2:
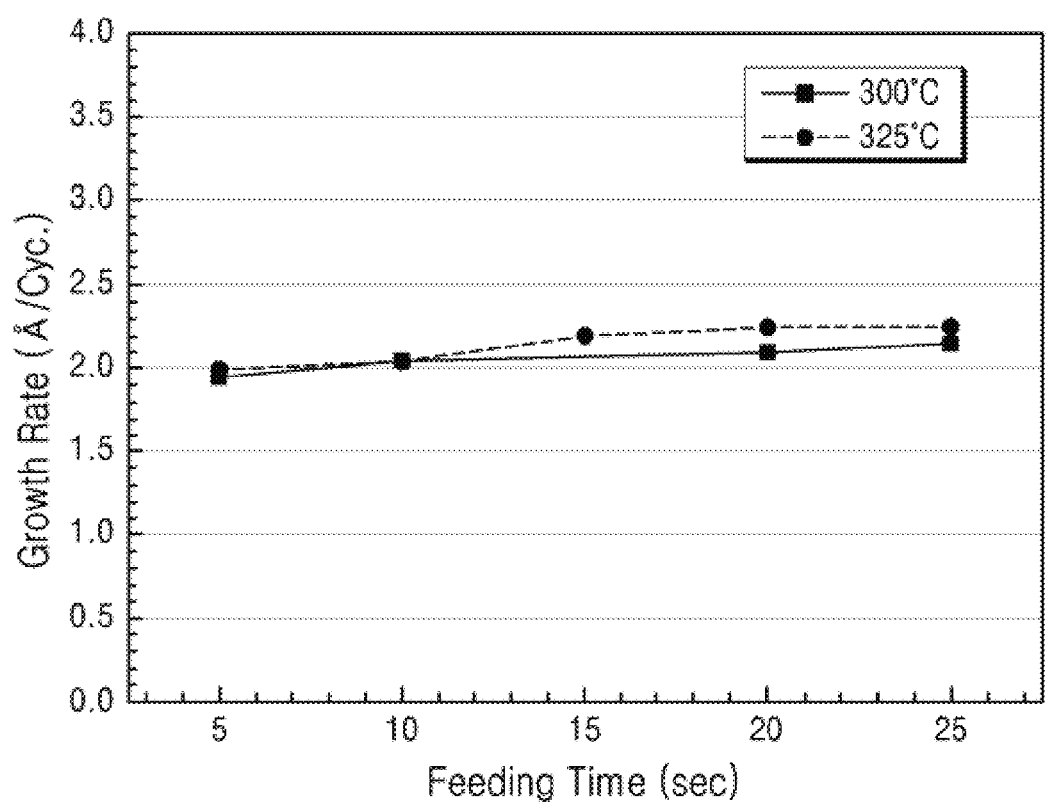
FIG. 2 shows the ALD film growths according to increasing the supply time of the aluminum compound in an ALD gas supply cycle at the substrate temperature of 300° C. and 325° C., respectively, when a thin film was formed according to Example 5 of the present disclosure using a liquid aluminum compound prepared according to Example 1 of the present disclosure.
Figure 3:
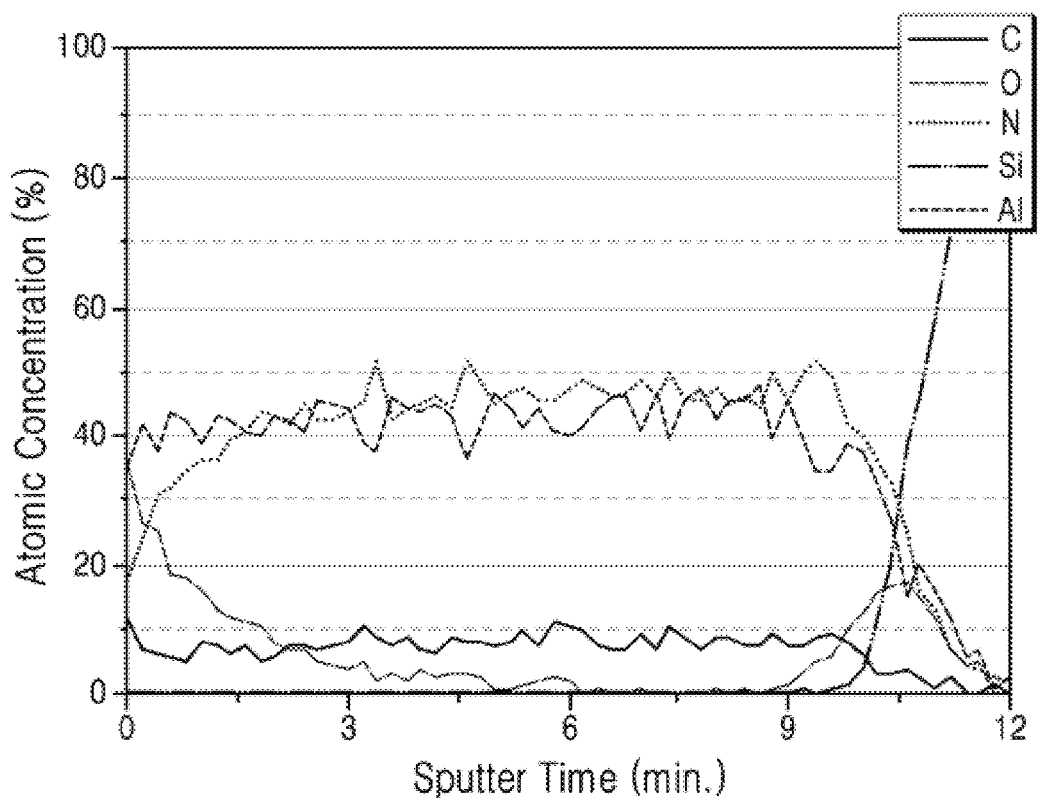
FIG. 3 shows Auger electron spectroscopy analysis result of the aluminum nitride film formed on a silicon (Si) substrate in accordance with Example 5 of the present disclosure.

When the substrate temperature was 300° C. or 325° C., $H_2Al(N^tBu(CH_2)_3NMe_2)$ vapor with argon carrier gas was supplied into the ALD reactor for 5, 10, 15, 20, or 25 seconds, and then, argon gas was supplied for 15 seconds, ammonia was supplied for 15 seconds, and argon gas was supplied again for 15 seconds to complete an ALD gas supply cycle, which was repeated 200 times. The cross section of the film formed by repeating the ALD gas supply cycle was observed under a scanning electron microscope (SEM) to measure the thickness of the aluminum nitride thin film. The ALD film growth obtained by dividing the measured thickness by the number of the gas supply cycles, i.e., 200, was shown according to the aluminum precursor supply time in FIG. 2. Unlike the case of using TMA and $NH_3$ that the film growth is continuously increased as the TMA supply time was increased, the film growth using $H_2Al(N^tBu(CH_2)_3NMe_2)$ and $NH_3$ demonstrates the advantage of ALD, i.e., no increase in the film growth even with increasing the $H_2Al$ $(N^tBu(CH_2)_3NMe_2)$ supply time. When the substrate temperature was 325° C., an aluminum nitride thin film was deposited by 200-times repeating the ALD gas supply cycle including the supply of the precursor for 20 seconds, the supply of argon gas for 15 seconds, the supply of ammonia for 15 seconds, and the supply of argon gas for 15 seconds and then the aluminum nitride thin film was analyzed by Auger electron spectroscopy to measure the atomic composition of the film depending on the depth. The depth profile atomic composition was as shown in FIG. 3. The oxygen atom concentration on the surface was high, but sharply decreased toward the inside of the film, and after sputtering for 6 minutes, no oxygen atom was detected. Since the aluminum nitride film was formed on the silicon substrate from which a native oxide film had not been removed, oxygen atoms detected after the sputtering time period of from 9 minutes to 12 minutes were generated from the native oxide film on the silicon substrate. It can be seen from the results shown in FIG. 3 that the film containing aluminum and nitrogen at a ratio of about 1:1 was formed. When an instable or non-dense aluminum nitride film is exposed to air, oxygen penetrates into the film. However, it can be seen that the above formed aluminum nitride film was sufficiently stable and dense from the fact that oxygen atoms did not penetrate into the film.

Figure 4A:
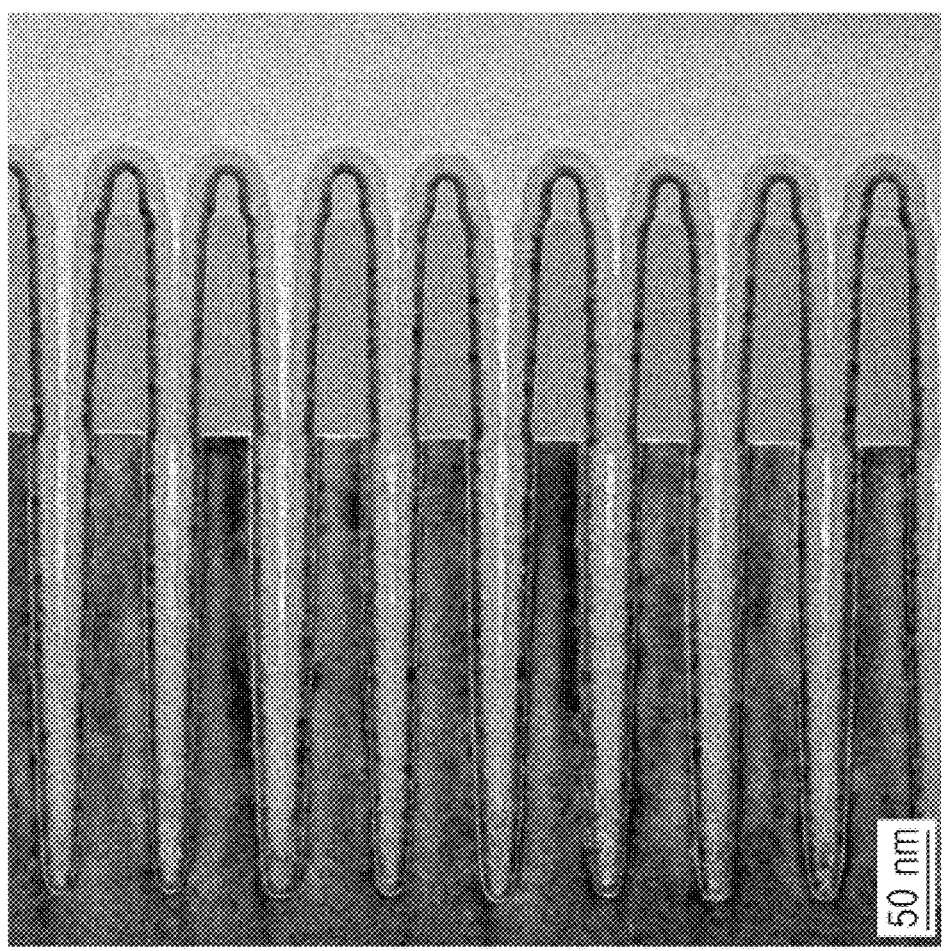
FIG. 4A, FIG. 4B and FIG. 4C show the images of transmission electron microscope (TEM) observation of the cross-section of the aluminum nitride thin film formed by repeating 50 times of the ALD cycle at 325° C. on the substrate including narrow trenches in accordance with Example 5 of the present disclosure.
Figure 4B:
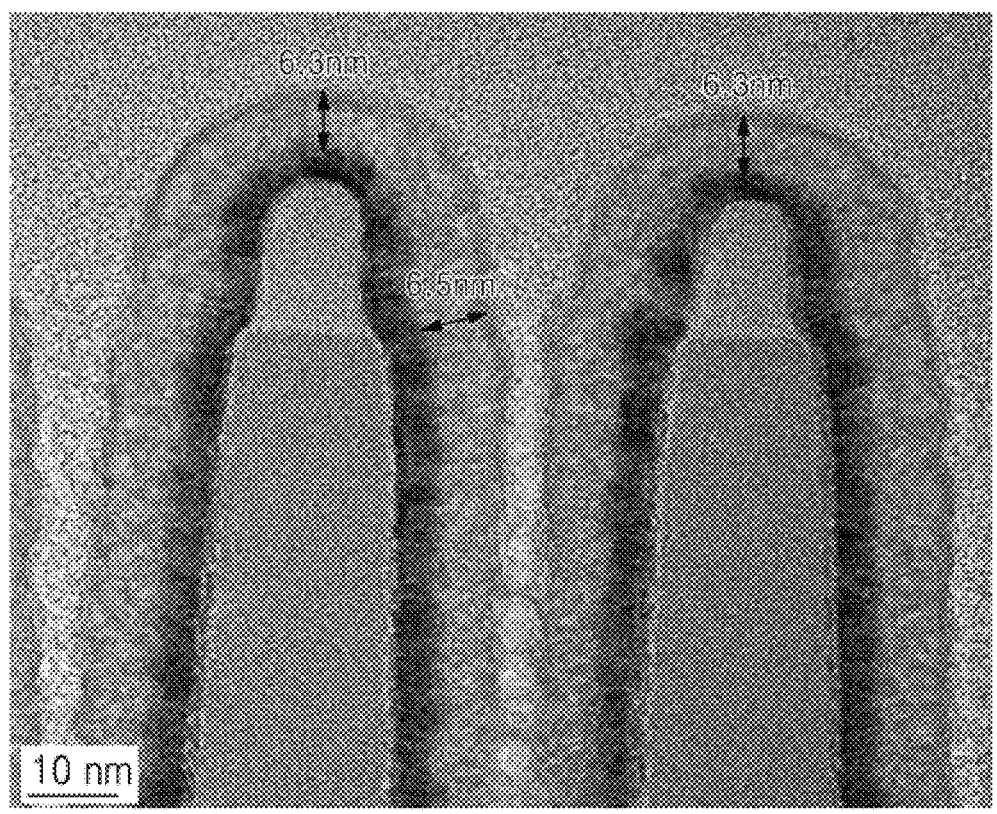
Figure 4C:
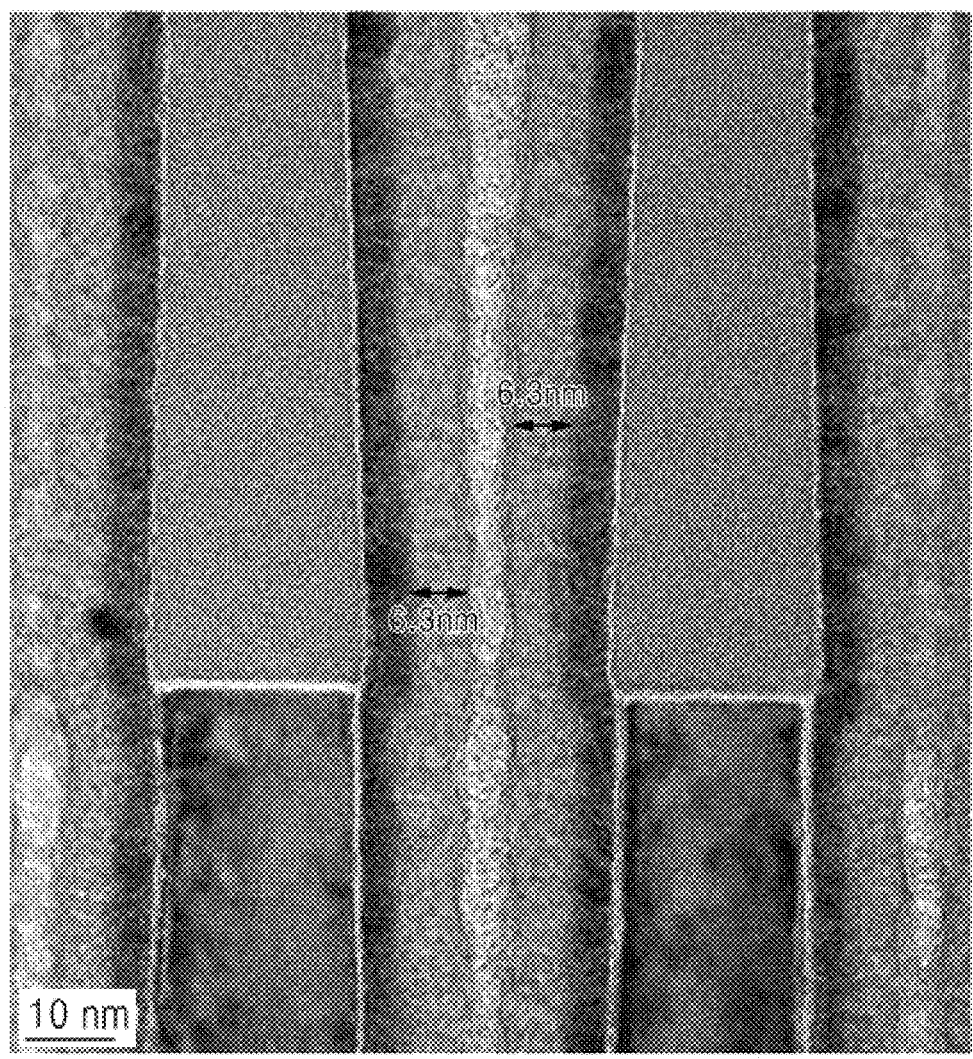

When the substrate temperature was 325° C., an aluminum nitride thin film was formed on a substrate including very narrow trenches having an aspect ratio of about 10:1 and a TiN film had been formed on its surface by repeating 50 times of the ALD gas supply cycle, and the cross section of the aluminum nitride thin film was observed under an transmission electron microscope (TEM). The results of the observation were as shown in FIG. 4A, FIG. 4B, and FIG. 4C. It could be seen that the film having a uniform thickness of from 6.3 nm to 6.5 nm was formed on the deepest portion and top of the trenches.

Figure 5A:
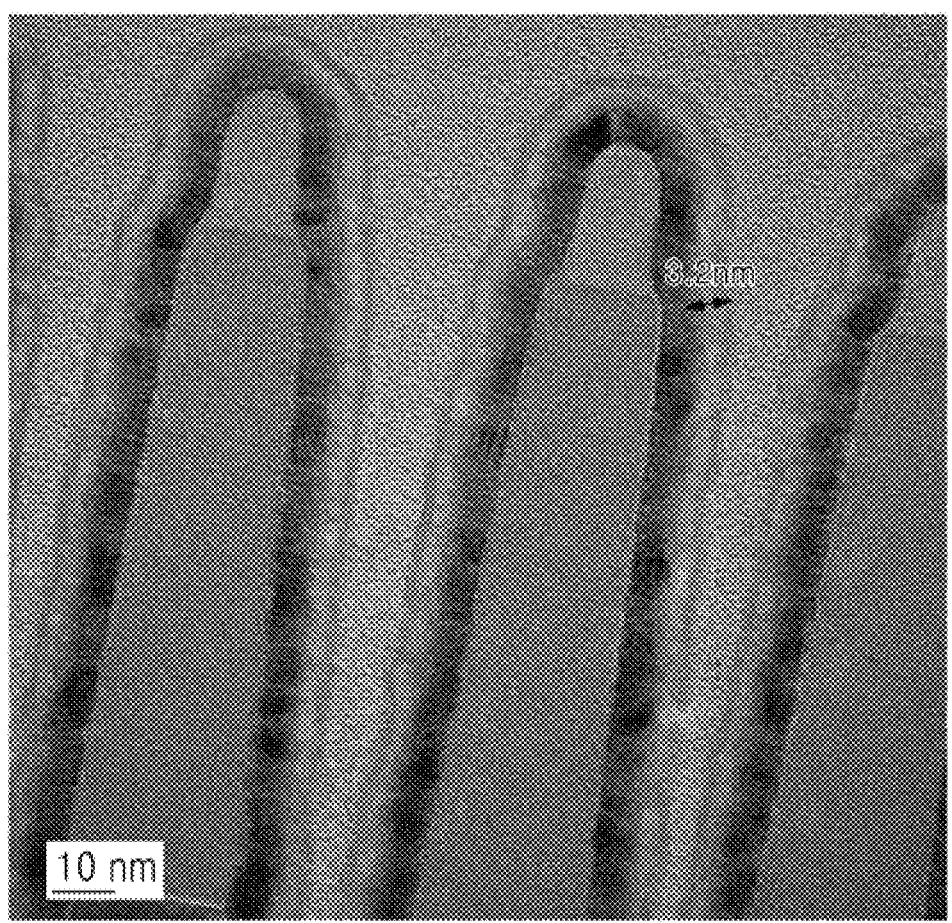
FIG. 5A, FIG. 5B and FIG. 5C show the images of transmission electron microscope (TEM) observation of the cross-section of the aluminum nitride thin film formed by repeating 30 times of the ALD cycle at 325° C. on the substrate including narrow trenches in accordance with Example 5 of the present disclosure.
Figure 5B:
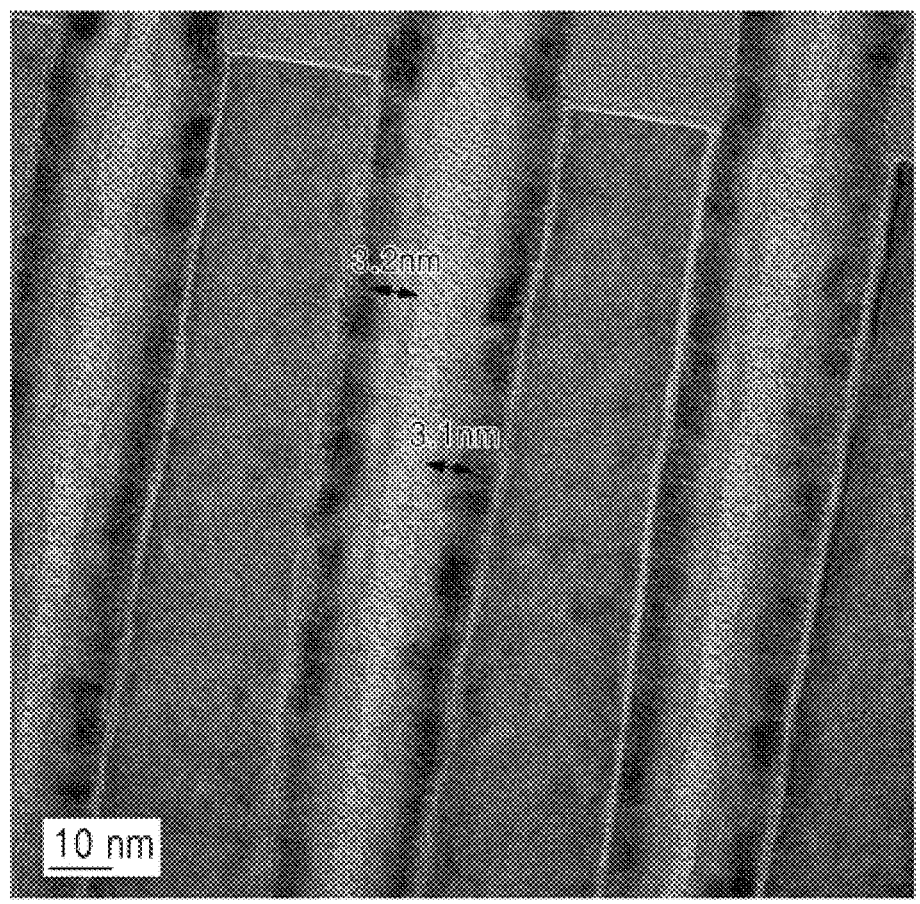
Figure 5C:
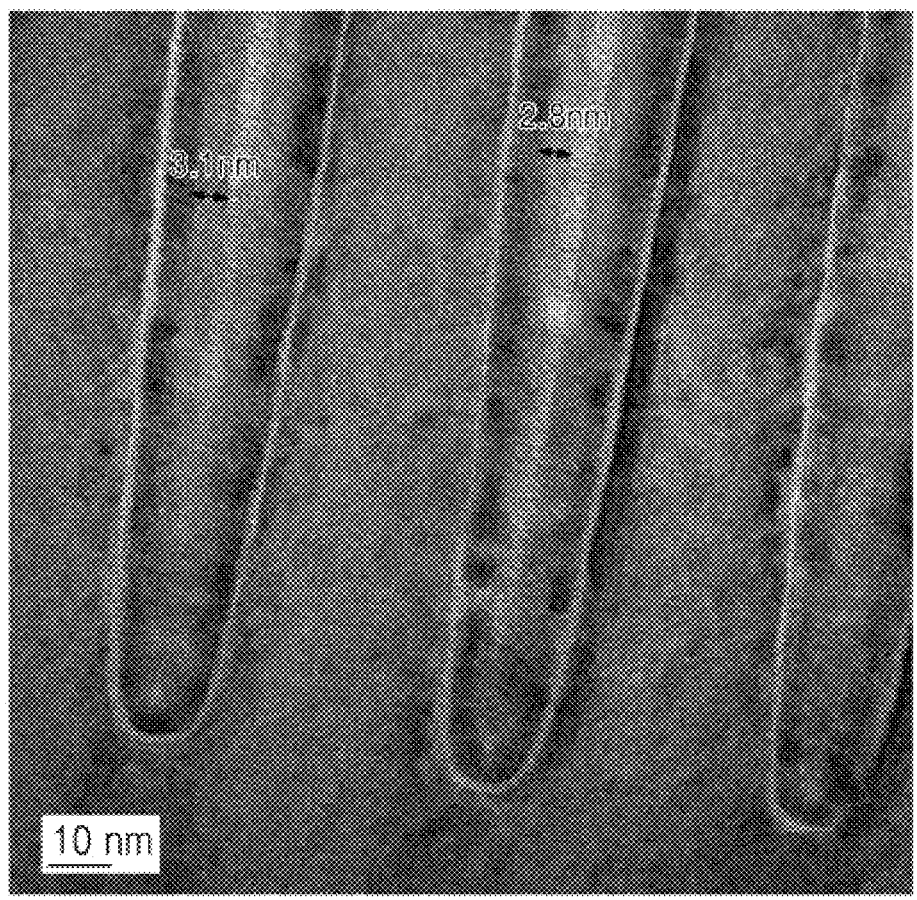

An aluminum nitride thin film was deposited by repeating 30 times of the ALD gas supply cycle when the substrate temperature was 325° C., and the cross section of the aluminum nitride thin film was observed under the TEM. The results of the observation were as shown in FIG. 5A, FIG. 5B, and FIG. 5C. It could be seen that the film having a uniform thickness of from 3.1 nm to 3.2 nm was formed on the deepest portions and tops of the trenches.

Figure 6A:
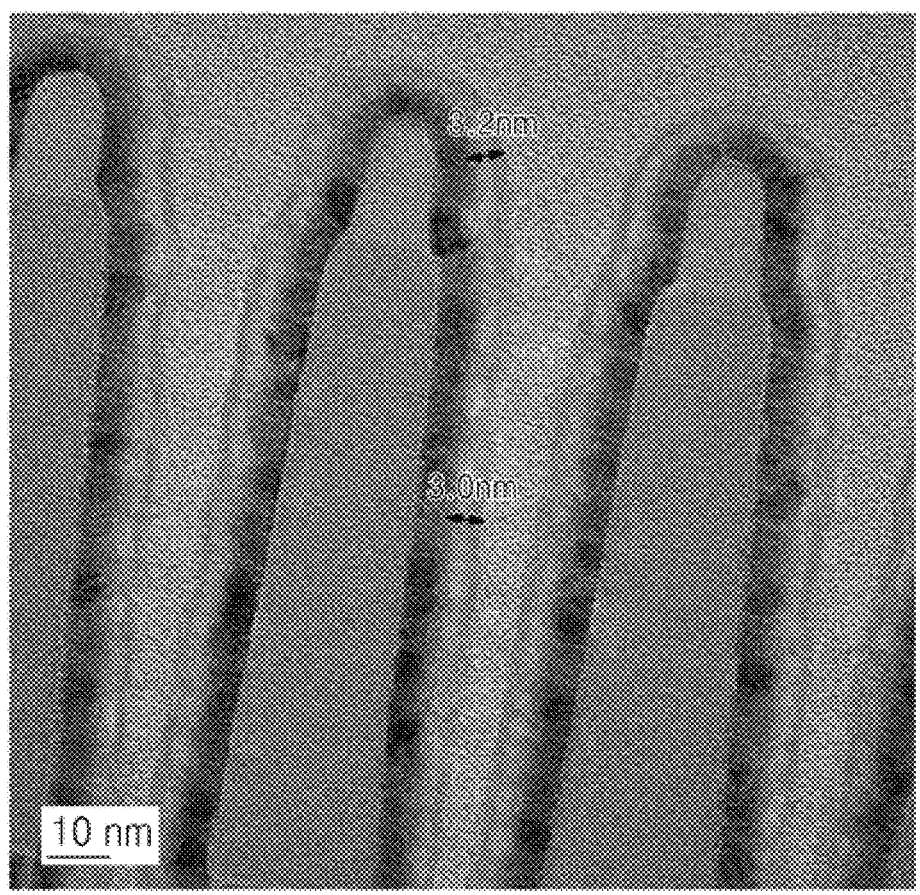
FIG. 6A, FIG. 6B and FIG. 6C show the images of transmission electron microscope (TEM) observation of the cross-section of the aluminum nitride thin film formed by repeating 30 times of the ALD cycle at 300° C. on the substrate including narrow trenches in accordance with Example 5 of the present disclosure.
Figure 6B:
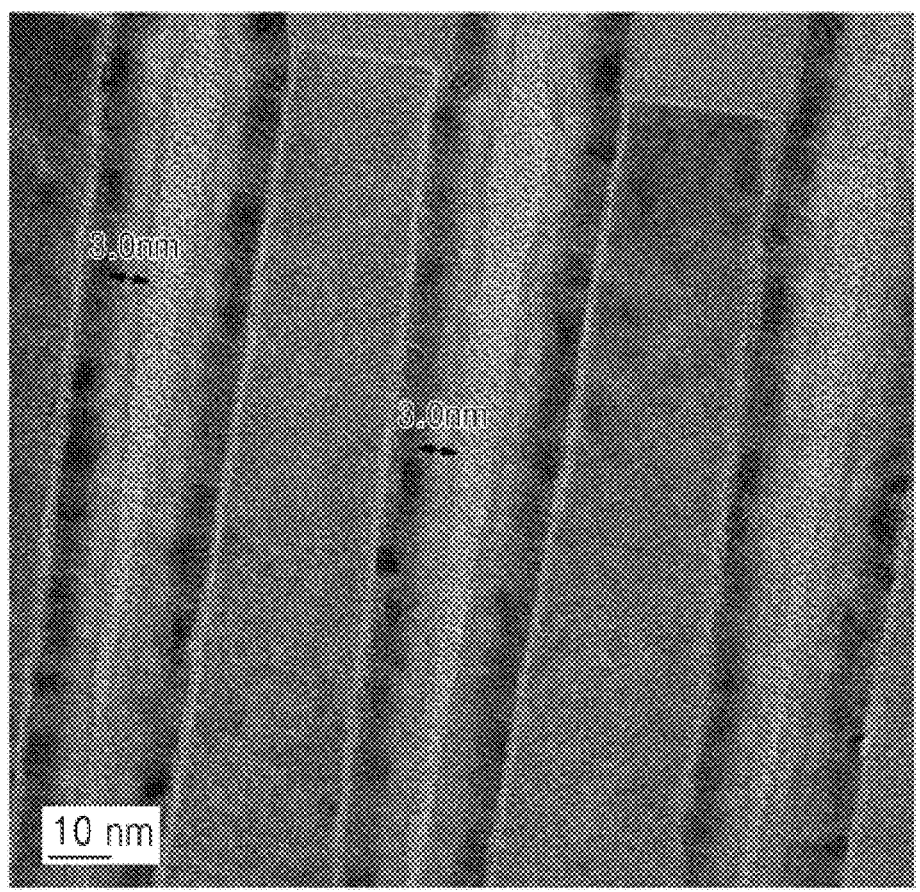
Figure 6C:
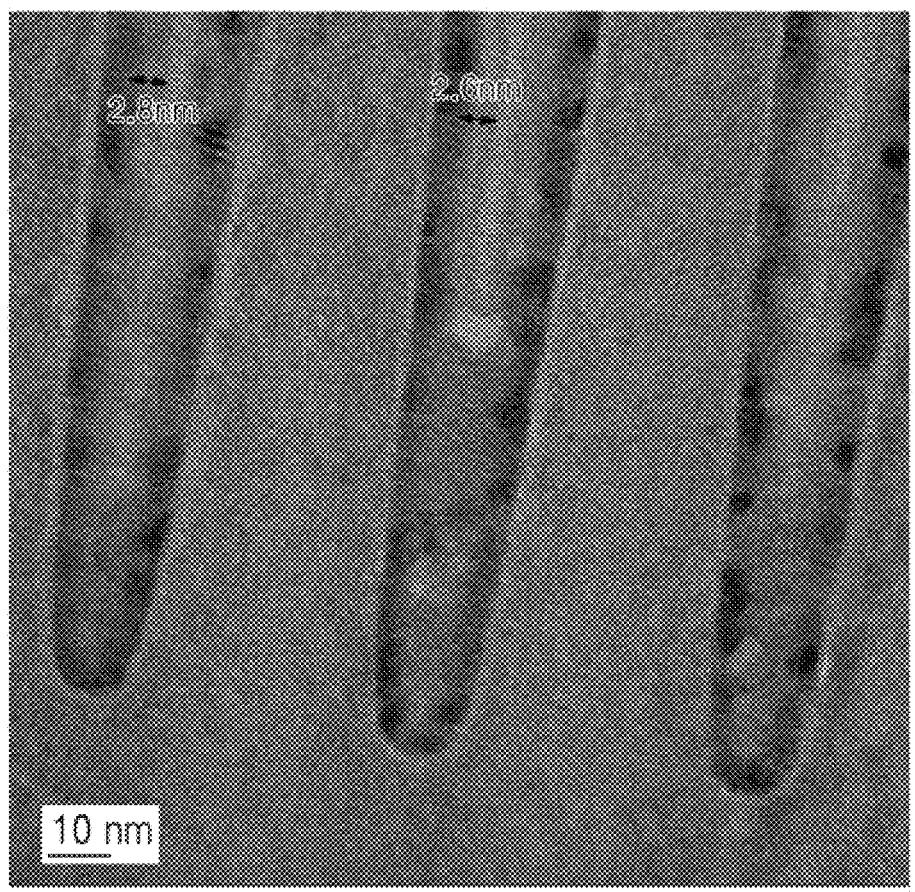

An aluminum nitride thin film was deposited by repeating 30 times of the ALD gas supply cycle when the substrate temperature was 300° C., and the cross section of the aluminum nitride thin film was observed under the TEM. The results of the observation were as shown in FIG. 6A, FIG. 6B, and FIG. 6C. It could be seen that the film having a uniform thickness of from 3.0 nm to 3.2 nm was formed on the deepest portions and tops of the trenches.

By comparison between FIG. 5A to FIG. 5C and FIG. 6A to FIG. 6C, it can be seen that the ALD film growths are uniform at the substrate temperatures of 300° C. and 325° C.

<Example 6> Formation of Aluminum Nitride (AlN) Thin Film Using Liquid Compound $(EtMeN)_2Al(NMe(CH_2)_3NMe_2)$ and Ammonia ($NH_3$)

Figure 7:
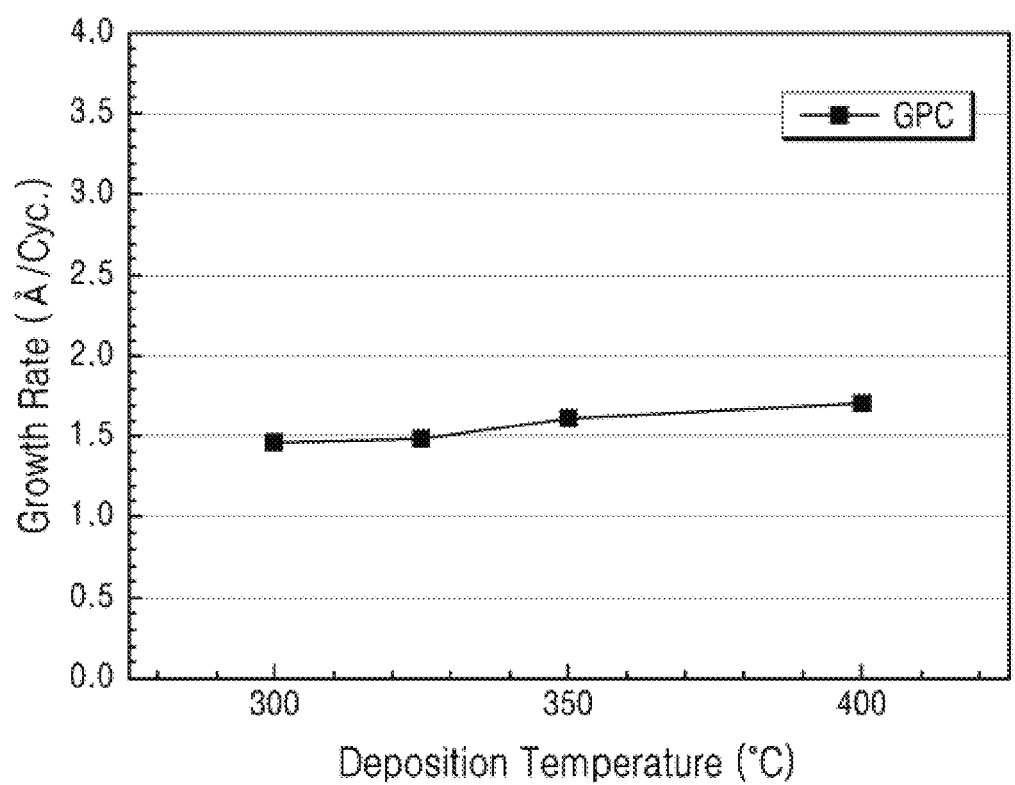
FIG. 7 shows the ALD film growth per cycle according to the substrate temperature for the aluminum nitride thin film formed according to Example 6 of the present disclosure using a liquid aluminum compound prepared according to Example 2 of the present disclosure.

An aluminum nitride thin film was formed by ALD using the compound $(EtMeN)_2Al(NMe(CH_2)_3NMe_2)$ prepared according to Example 2 as a precursor and ammonia ($NH_3$) as a reaction gas. The aluminum nitride thin film was formed on a silicon (Si) wafer using as a substrate in the ALD reactor as used in Example 5. The substrate was heated to temperatures of 300° C., 325° C., 350° C., and 400° C., and $(EtMeN)_2Al(NMe(CH_2)_3NMe_2)$ was put in a stainless-steel container was heated to a temperature of 95° C. and then supplied using argon (Ar) carrier gas. Ammonia was supplied into the ALD reactor at a flow rate of 200 sccm. $(EtMeN)_2Al(NMe(CH_2)_3NMe_2)$ vapor with argon carrier gas was supplied into the ALD reactor for 15 seconds, and then, argon gas was supplied for 15 seconds, ammonia was supplied for 15 seconds, and argon gas was supplied again for 15 seconds to complete an ALD gas supply cycle, which was repeated 200 times. Aluminum nitride films were formed by the above-described process at the substrate temperatures of 300° C., 325° C., 350° C., and 400° C., respectively, and the cross sections of the films were observed under the SEM. As the result of observation, the measured thicknesses of the films were 29.1 nm, 30.1 nm, 32.1 nm, and 34.0 nm, respectively. The ALD film growth obtained by dividing the measured thickness by the number of the gas supply cycles, i.e., 200, was as shown in FIG. 7. Referring to FIG. 7, it can be seen that unlike the case of using TMA and NH₃, when (EtMeN)₂Al(NMe(CH₂)₃NMe₂) and NH₃ were used, the ALD film growth was not sharply increased but relatively uniform as the substrate temperature was increased.

<Example 7> Formation of Aluminum Oxide (Al₂O₃) Thin Film Using Liquid Compound H₂Al(N$^t$Bu(CH₂)₃NMe₂) and Ozone (O₃)

An aluminum oxide thin film was formed by ALD using the compound H₂Al(N$^t$Bu(CH₂)₃NMe₂) prepared according to Example 1 as a precursor, ozone (O₃) as a reaction gas, and silicon (Si) wafer as a substrate. The substrate was heated to a temperature in the range of from 250° C. to 350° C., and H₂Al(N$^t$Bu(CH₂)₃NMe₂) was put in a stainless-steel container was heated to a temperature of 65° C. and then supplied using argon (Ar) carrier gas. Ozone produced using oxygen gas at a flow rate of 1,000 sccm was supplied into the ALD reactor. H₂Al(N$^t$Bu(CH₂)₃NMe₂) vapor with argon carrier gas was supplied into the ALD reactor for 15 seconds, and then, argon gas was supplied and purged for 20 seconds, ozone was supplied for 15 seconds, and argon gas was supplied and purged for 15 seconds to complete a cycle, which was repeated 200 times. The thicknesses of the aluminum oxide thin films formed by the above-described process were measured, and it could be seen that the film growth per ALD gas supply cycle was relatively uniform at the substrate temperature in the range of from about 250° C. to about 350° C.

<Example 8> Formation of Aluminum Oxide (Al₂O₃) Thin Film Using Liquid Compound (EtMeN)₂Al(NMe(CH₂)₃NMe₂) and Ozone (O₃)

Figure 8:
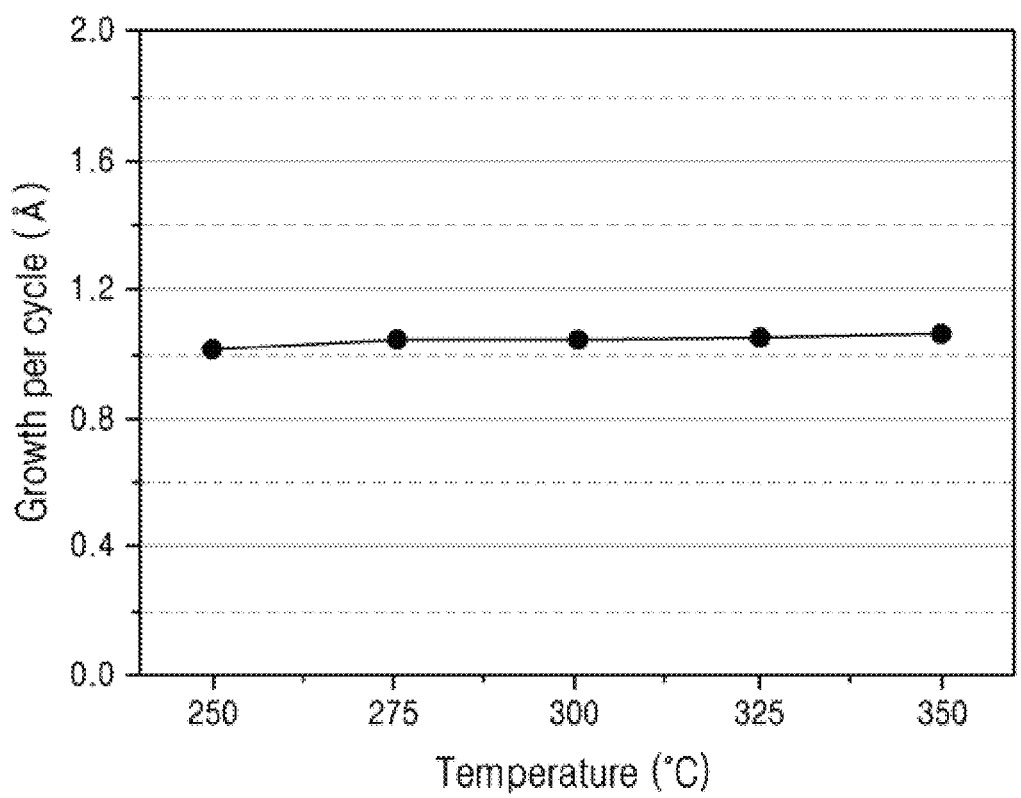
FIG. 8 shows the ALD film growth per cycle according to the substrate temperature for the aluminum oxide film formed according to Example 8 of the present disclosure.

An aluminum oxide thin film was formed in the reactor as used in Example 7 by ALD using the compound (EtMeN)₂Al(NMe(CH₂)₃NMe₂) prepared according to Example 2 as a precursor, ozone (O₃) as a reaction gas, and silicon (Si) wafer as a substrate. The substrate was heated to a temperature in the range of from about 250° C. to about 350° C., and (EtMeN)₂Al(NMe(CH₂)₃NMe₂) was put in a stainless-steel container was heated to a temperature of 90° C. and then supplied using argon (Ar) carrier gas. Ozone produced using oxygen gas at a flow rate of 1,000 sccm was supplied into the ALD reactor. (EtMeN)₂Al(NMe(CH₂)₃NMe₂) vapor with argon carrier gas was supplied into the ALD reactor for 3 seconds, and then, argon gas was supplied and purged for 5 seconds, ozone was supplied for 5 seconds, and argon gas was supplied and purged for 10 seconds to complete a cycle, which was repeated 200 times. The film growth per ALD gas supply cycle of the aluminum oxide thin films formed by the above-described process was as shown in FIG. 8. As shown in FIG. 8, it could be seen that the film growth per ALD gas supply cycle was relatively uniform at the substrate temperature in the range of from about 250° C. to about 350° C.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner.

Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An aluminum-containing compound, represented by the following Chemical Formula 2,

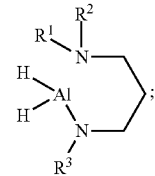

[Chemical Formula 2]

wherein, in the above Chemical Formula 2,
   each of R¹ and R² is independently a linear or branched alkyl group having 1 to 3 carbon atoms, and
   R³ is a linear or branched alkyl group having 4 or 5 carbon atoms, and
wherein the aluminum-containing compound is liquid at room temperature.

2. The compound of claim 1,
wherein each of R¹ and R² is independently methyl, ethyl, n-propyl, or iso-propyl, and
R³ is iso-butyl, sec-butyl, tert-butyl, n-pentyl, iso-pentyl, sec-pentyl, tert-pentyl, neo-pentyl, or 3-pentyl.

3. The compound of claim 1,
wherein the aluminum-containing compound is H₂Al[N$^i$Bu(CH₂)₃NMe₂], H₂Al[N$^t$Bu(CH₂)₃NMe₂], H₂Al[N$^{sec}$Bu(CH₂)₃NMe₂], H₂Al[N$^{neo}$Pe(CH₂)₃NMe₂], H₂Al[N$^t$Bu(CH₂)₃NetMe], or H₂Al[N$^t$Bu(CH₂)₃NEt₂].

4. A precursor composition for forming a film, comprising an aluminum-containing precursor compound represented by the following Chemical Formula 2:

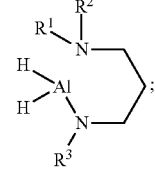

[Chemical Formula 2]

wherein, in the above Chemical Formula 2,
   each of R¹ and R² is independently a linear or branched alkyl group having 1 to 53 carbon atoms, and
   R³ is a linear or branched alkyl group having 4 or 5 carbon atoms, and
wherein the aluminum-containing precursor compound is liquid at room temperature.

5. The precursor composition of claim 4,
wherein the precursor composition is for forming an aluminum nitride film.

6. The precursor composition of claim 4,
wherein the aluminum-containing precursor compound is at least one selected from H₂Al[N$^i$Bu(CH₂)₃NMe₂], H₂Al[N$^t$Bu(CH₂)₃NMe₂], H₂Al[N$^{sec}$Bu(CH₂)₃NMe₂], H₂Al[N$^{neo}$Pe(CH₂)₃NMe₂], H₂Al[N$^t$Bu(CH₂)₃NetMe], and H₂Al[N$^t$Bu(CH₂)₃NEt₂].

7. The precursor composition of claim 4, further comprising:
at least one nitrogen source selected from ammonia, nitrogen, hydrazine, and dimethyl hydrazine.

8. A method of forming an aluminum-containing film, comprising: forming the aluminum-containing film using a precursor composition for forming a film comprising an aluminum-containing precursor compound represented by the following Chemical Formula 2:

[Chemical Formula 2]

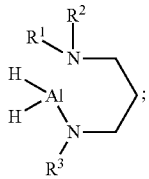

wherein, in the above Chemical Formula 2,
each of R¹ and R² is independently a linear or branched alkyl group having 1 to 53 carbon atoms, and
R³ is a linear or branched alkyl group having 4 or 5 carbon atoms, and
wherein the aluminum-containing precursor compound is liquid at room temperature.

9. The method of claim 8,
wherein the aluminum-containing film includes an aluminum nitride film.

10. The method of claim 8,
wherein the aluminum-containing film is deposited by thermal atomic layer deposition.

11. The method of claim 4,
wherein the aluminum-containing precursor compound is at least one selected from H₂Al[N$^t$Bu(CH₂)₃NMe₂], H₂Al[N$^i$Bu(CH₂)₃NMe₂], H₂Al[N$^{sec}$Bu(CH₂)₃NMe₂], H₂Al[N$^{neo}$Pe(CH₂)₃NMe₂], H₂Al[N$^t$Bu(CH₂)₃NetMe], and H₂Al[N$^t$Bu(CH₂)₃NEt₂].

* * * * *